US008005166B2

(12) United States Patent
Limberg

(10) Patent No.: US 8,005,166 B2
(45) Date of Patent: Aug. 23, 2011

(54) SYSTEM FOR DIGITAL TELEVISION BROADCASTING USING MODIFIED 2/3 TRELLIS CODING

(75) Inventor: Allen LeRoy Limberg, Port Charlotte, FL (US)

(73) Assignee: Samsung Electronics Co., Ltd., Suwon-si (KR)

( * ) Notice: Subject to any disclaimer, the term of this patent is extended or adjusted under 35 U.S.C. 154(b) by 904 days.

(21) Appl. No.: 11/978,462

(22) Filed: Oct. 29, 2007

(65) Prior Publication Data
US 2008/0112502 A1    May 15, 2008

Related U.S. Application Data

(60) Provisional application No. 60/858,887, filed on Nov. 14, 2006, provisional application No. 60/861,507, filed on Nov. 28, 2006.

(51) Int. Cl.
H04L 27/00 (2006.01)
(52) U.S. Cl. ......................................... 375/301; 375/265
(58) Field of Classification Search .................. 375/270, 375/265, 301; 714/792, 784, 786; 348/466
See application file for complete search history.

(56) References Cited

U.S. PATENT DOCUMENTS

| 2,632,058 | A | 3/1953 | Gray |
| 4,622,670 | A | 11/1986 | Martin |
| 4,975,698 | A | 12/1990 | Kagey |
| 5,825,832 | A | 10/1998 | Benedetto et al. |
| 6,269,125 | B1 * | 7/2001 | Seccia et al. ................... 375/265 |
| 6,353,911 | B1 | 3/2002 | Brink |
| 7,154,936 | B2 | 12/2006 | Bjerke et al. |
| 7,372,896 | B2 | 5/2008 | Bjerke et al. |
| 7,383,493 | B2 | 6/2008 | Shen et al. |
| 2002/0172277 | A1 * | 11/2002 | Choi et al. ................ 375/240.01 |
| 2002/0191712 | A1 * | 12/2002 | Gaddam et al. ............... 375/301 |
| 2002/0194570 | A1 * | 12/2002 | Birru et al. ..................... 714/792 |
| 2003/0079173 | A1 * | 4/2003 | Birru ............................. 714/792 |
| 2003/0103584 | A1 | 6/2003 | Bjerke et al. |
| 2005/0074069 | A1 * | 4/2005 | Choi et al. .................... 375/265 |
| 2005/0157811 | A1 | 7/2005 | Bjerke et al. |
| 2005/0249301 | A1 * | 11/2005 | Jeong et al. ................... 375/265 |
| 2008/0163025 | A1 | 7/2008 | Djordjevic et al. |
| 2008/0212657 | A1 | 9/2008 | Bjerke et al. |
| 2009/0180495 | A1 | 7/2009 | Li et al. |

OTHER PUBLICATIONS

Altera White Paper, "Versatile Digital QAM Modulator", Altera, Jan. 2006.*

(Continued)

*Primary Examiner* — Chieh M Fan
*Assistant Examiner* — Aristocratis Fotakis
(74) *Attorney, Agent, or Firm* — Sughrue Mion, PLLC

(57) ABSTRACT

8VSB-compatible DTV broadcasting that employs outer coding of a sort in which interleaved data and outer coding parity are inner coded by the ⅔ trellis code encoder is improved. This is done by recoding each successive pair of bits in the interleaved data and outer coding parity in accordance with an "anti-Gray" code before being inner coded by the ⅔ trellis code encoder. Accordingly, in the DTV receiver an adjacent-bin error during data slicing may generate a double-bit error in a pair of bits as ⅔ trellis decoded, but this is reduced to a single-bit error after the pair of bits is recoded in accordance with a Gray coding procedure. In one example of such recoding, 10 and 11 bit-pairs of the interleaved data and outer coding parity are recoded to 11 and 10 bit-pairs respectively, but the 00 and 01 bit-pairs are not recoded.

9 Claims, 25 Drawing Sheets

OTHER PUBLICATIONS

Michael Tuchler, "Design of serially concatenated systems for long or short block lengths", Munich University of Technology, Germany, May 2003, IEEE.*

Stephan ten Brink, Joachim Speidel and Ran-Hong Yan, "Iterative demapping and decoding for multilevel modulation", Stuttgart University, Germany and Lucent Technologies, England, IEEE 1998.*

* cited by examiner

Fig. 1

| 3-BYTE PACKET HEADER | 184-BYTE PAYLOAD FIELD WITH ANTI-GRAY-CODED ANCILLARY DATA | 20 PARITY BYTES OF (207, 187) REED-SOLOMON CODEWORD |

Fig. 2

| 3-BYTE PACKET HEADER | 3-BYTE A. FIELD HEADER | 181-BYTE ADAPTATION FIELD WITH ANTI-GRAY-CODED ANCILLARY DATA | 20 PARITY BYTES OF (207, 187) REED-SOLOMON CODEWORD |

Fig. 3

| 3-BYTE PACKET HEADER | 3-BYTE A. FIELD HEADER | N-BYTE ADAPTATION FIELD WITH ANTI-GRAY-CODED ANCILLARY DATA | M-BYTE PAYLOAD FIELD M = 181 - N | 20 PARITY BYTES OF (207, 187) REED-SOLOMON CODEWORD |

Fig. 4

| 3-BYTE PACKET HEADER | 3-BYTE A. FIELD HEADER | N-BYTE ADAPTATION FIELD, WITH ANTI-GRAY-CODED ANCILLARY DATA AND WITH 20 PARITY BYTES OF THE (207, 187) REED-SOLOMON CODEWORD | M-BYTE PAYLOAD FIELD (OPTIONALLY ANTI-GRAY-CODED ANCILLARY DATA) |

| RECODING TABLE 1 ||
|---|---|
| ORIGINAL NIBBLE | TRANSMITTED NIBBLE |
| 00 | 00 |
| 01 | 01 |
| 11 | 10 |
| 10 | 11 |

Fig. 6

| RECODING TABLE 2 ||
|---|---|
| ORIGINAL NIBBLE | TRANSMITTED NIBBLE |
| 10 | 00 |
| 00 | 01 |
| 01 | 10 |
| 11 | 11 |

Fig. 7

| RECODING TABLE 3 ||
|---|---|
| ORIGINAL NIBBLE | TRANSMITTED NIBBLE |
| 11 | 00 |
| 10 | 01 |
| 00 | 10 |
| 01 | 11 |

Fig. 8

| RECODING TABLE 4 ||
|---|---|
| ORIGINAL NIBBLE | TRANSMITTED NIBBLE |
| 01 | 00 |
| 11 | 01 |
| 10 | 10 |
| 00 | 11 |

Fig. 9

| RECODING TABLE 5 | |
|---|---|
| ORIGINAL NIBBLE | TRANSMITTED NIBBLE |
| 00 | 00 |
| 10 | 01 |
| 11 | 10 |
| 01 | 11 |

Fig. 10

| RECODING TABLE 6 | |
|---|---|
| ORIGINAL NIBBLE | TRANSMITTED NIBBLE |
| 01 | 00 |
| 00 | 01 |
| 10 | 10 |
| 11 | 11 |

Fig. 11

| RECODING TABLE 7 | |
|---|---|
| ORIGINAL NIBBLE | TRANSMITTED NIBBLE |
| 11 | 00 |
| 01 | 01 |
| 00 | 10 |
| 10 | 11 |

Fig. 12

| RECODING TABLE 8 | |
|---|---|
| ORIGINAL NIBBLE | TRANSMITTED NIBBLE |
| 10 | 00 |
| 11 | 01 |
| 01 | 10 |
| 00 | 11 |

Fig. 13

SYSTEM FOR DIGITAL TELEVISION BROADCASTING USING MODIFIED 2/3 TRELLIS CODING

This application is filed under 35 U.S.C. 111(a) claiming pursuant to 35 U.S.C. 119(e)(1) benefit of the filing date of provisional patent application Ser. Nos. 60/858,887 and 60/861,507 filed under 35 U.S.C. 111(b) on 14 Nov. 2006 and 28 Nov. 2006, respectively. Provisional patent application Ser. Nos. 60/858,887 and 60/861,507 are each incorporated herein by reference.

The invention relates to digital television (DTV) signals for over-the-air broadcasting, to transmitters for such broadcast DTV signals and to receivers for such broadcast DTV signals.

BACKGROUND OF THE INVENTION

The Advanced Television Systems Committee (ATSC) published a Digital Television Standard in 1995 as Document A/53, hereinafter referred to simply as "A/53" for sake of brevity. Annex D of A/53 titled "RF/Transmission Systems Characteristics" is particularly incorporated by reference into this specification. So is Section 5.6.3 titled "Specification of private data services" from Annex C of A/53.

In 2007 Samsung Electronics Co., Ltd. proposed introducing turbo-coded ancillary data into adaptation fields of the 187-byte MPEG-2-compatible data packets included in the 207-byte data segments of the 8VSB DTV broadcast signals used in the United States. This scheme called "AVSB" is championed because the packet decoders in legacy DTV receivers can readily disregard the turbo-coded ancillary datastream, providing a form of backward compatibility in which those legacy DTV receivers can still receive a principal datastream transmitted in the data fields of the 187-byte MPEG-2-compatible data packets. Variants of AVSB should be possible in which the turbo-coded ancillary datastream occupies 184-byte payload fields of the 187-byte MPEG-2-compatible data packets, it is here noted. Other variants of AVSB should be possible in which the turbo-coded ancillary datastream occupies complete 207-byte data segments, it is also here noted.

In its turbo coding AVSB uses an outer encoder similar to that used in the Universal Mobile Telecommunications System (UMTS) specification of the European Telecommunications Standards Institute, as standardized by the Third-Generation Partnership Project (3GPP). The original data and the outer encoding parity bits are bit interleaved. Then, the ⅔ trellis coding specified in A/53 provides the inner coding of the turbo coding.

The 8-level symbol mapping specified in A/53 maps each group of $Z_2$, $Z_1$ and $Z_0$ bits into a respective eight-level VSB symbol in accordance with simple binary coding. This results in the $Z_2$ and $Z_2$ bits of original data both changing value between the 011 and 100 levels. This makes a double-bit error likely when noise causes an adjacent-bin error during data slicing in this region of the symbol map. Only Reed-Solomon coding with 8-bit bytes is concatenated after the ⅔ trellis coding in ordinary 8VSB transmissions as specified by A/53, so the double-bit errors being within single bytes affect overall coding being found correct no more than single-bit errors within single bytes. However, when further convolutional coding is introduced after the ⅔ trellis coding, the double-bit errors are more disruptive than single-bit errors.

Digital transmission system using multi-level symbols generated by Gray coding are known. An adjacent-bin error will cause only a single-bit error in an 8-level symbol using Gray code symbol mapping, rather than a double-bit or triple-bit error. However, symbol mapping using Gray code over all eight modulation levels is incompatible with ⅔ trellis coding, especially when bytes of AVSB coding are interleaved with bytes of ordinary 8VSB coding. So, initially, the inventor was unable to discern how to utilize effectively the general idea of avoiding an adjacent-bin error during data slicing generating double-bit errors in a special type of turbo coding designed for digital television broadcasting.

After further consideration, the inventor was able to figure out how to avoid an adjacent-bin error during data slicing generating double-bit errors in nibbles each composed of a Z-sub-2 bit and a Z-sub-1 bit. (In this specification and its accompanying drawing, the word "nibble" refers to a pair of bits. This is a departure from conventional usage in digital electronics, in which conventional usage the words "nibble" and "nybble" refer to a group of four bits that are half of an 8-bit byte. In this specification and the claims that follow the term "anti-Gray coding" refers to coding of groups of bits that when followed by Gray coding results in recovery of the original groups of bits. This is different from another definition of "anti-Gray coding" used in digital electronics wherein successive levels of a plural-level code exhibit maximum Hamming distances between adjoining levels.) Each 2-bit nibble composed of a Z-sub-2 bit and a Z-sub-1 bit could be anti-Gray coded before ⅔ trellis coding in the DTV transmitter. Then, subsequent to ⅔ trellis decoding in the DTV receiver, each 2-bit nibble could be Gray coded to counter the effects of the anti-Gray coding. Surprisingly, this procedure converts the symbol mapping into modulation levels to Gray coding insofar as the two more significant bits of the 3-bit symbols are concerned. Another surprising result of this procedure is that extends the effects of the ⅔ trellis decoding from just the Z-sub-1 bits to the Z-sub-2 bits as well. After this insight into how to avoid an adjacent-bin error during data slicing generating double-bit errors in nibbles each composed of a Z-sub-2 bit and a Z-sub-1 bit, there remained further problems of designing DTV transmitter and DTV receiver configurations to exploit the insight.

SUMMARY OF THE INVENTION

A transmitter aspect of the invention concerns improvement of 8VSB-compatible digital television broadcasting equipment that employs outer coding of a sort in which interleaved data and outer coding parity are inner coded by the ⅔ trellis code encoder. In the improvement each nibble of the interleaved data and outer coding parity is recoded in accordance with an anti-Gray code before being inner coded by the ⅔ trellis code encoder. The recoding is such that no adjacent-bin error during data slicing generates a double-bit error in any nibble recovered at the receiver by recoding a reproduced X-sub-2 bit and a X-sub-1 bit in accordance with a Gray coding procedure. In one example of such recoding, 10 and 11 nibbles of the interleaved data and outer coding parity are recoded to 11 and 10 nibbles respectively, but the 00 and 01 nibbles are not recoded. In another example of such recoding, 00 and 01 nibbles of the interleaved data and outer coding parity are recoded to 01 and 00 nibbles respectively, but the 10 and 11 nibbles are not recoded. Eight different types of recoding are possible.

A receiver aspect of the invention concerns improvement within a receiver for receiving an 8VSB-compatible digital television broadcast signal employing anti-Gray-coded outer coding of the sort described in the previous paragraph. After decoding the trellis code and de-interleaving bytes of data segments, the nibbles each composed of a Z-sub-2 bit and a Z-sub-1 bit are Gray coded to restore original bit-interleaved data and outer coding parity before de-interleaving and decoding procedures for the outer coding.

BRIEF DESCRIPTION OF THE DRAWING

FIGS. 1, 2, 3 and 4 are depictions of representative (207, 187) Reed-Solomon forward-error-correction codewords for use in digital television broadcasting, which codewords in accordance with the invention include symbols of anti-Gray code.

FIGS. 6 through 13 are tables of different forms of recoding that are used in respective embodiments of the FIG. 5 transmitter apparatus.

DETAILED DESCRIPTION

Figure 5:
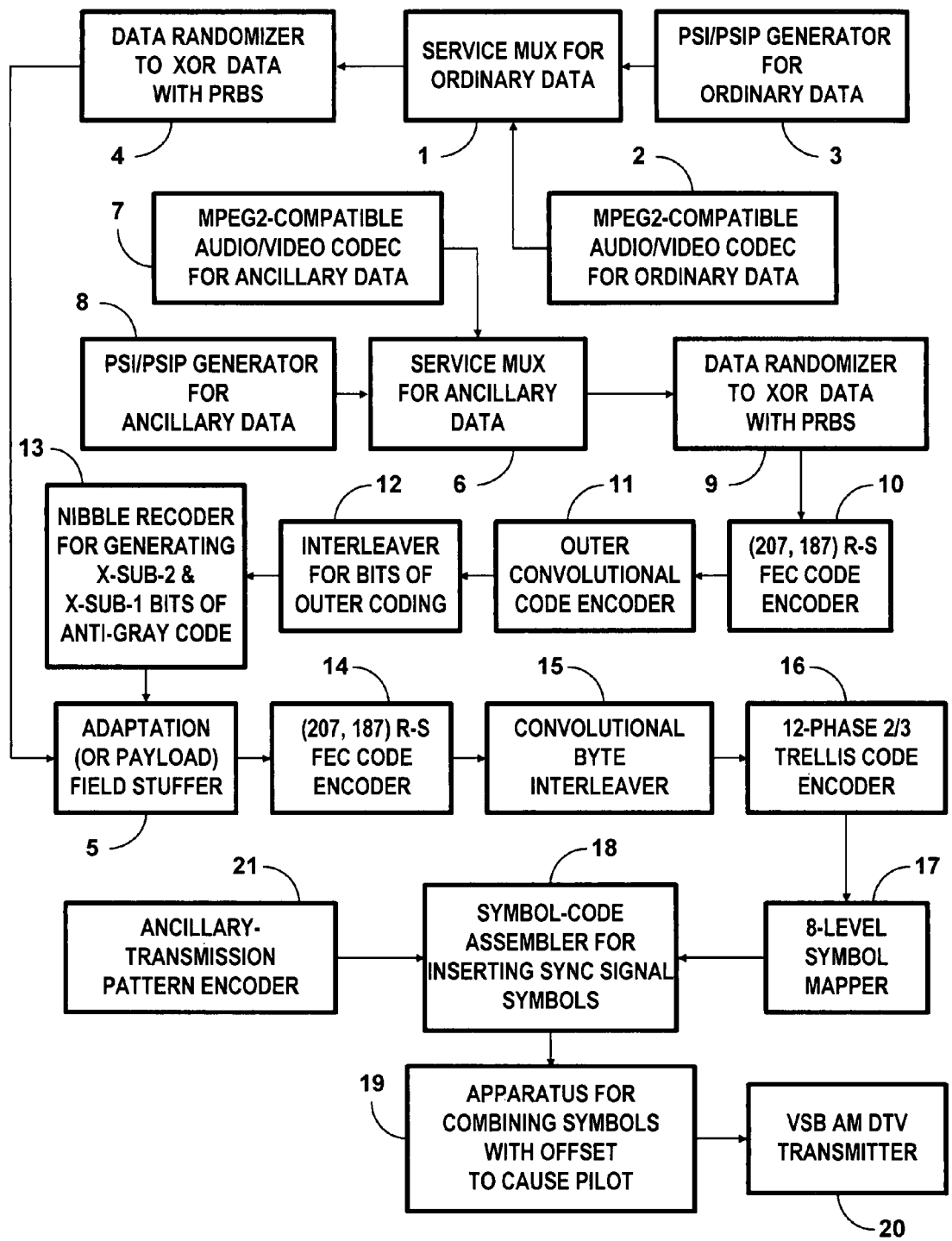
FIG. 5 is a general schematic diagram of transmitter apparatus for broadcast digital television signals using serially concatenated convolutional coding (SCCC), which transmitter apparatus embodies aspects of the invention.

Each of FIGS. 1, 2, 3 and 4 depicts a respective type of (207, 187) Reed-Solomon forward-error-correction codeword as supplied to a convolutional byte interleaver within DTV transmitter apparatus for convolutional byte interleaving as prescribed in A/53, Annex D, §4.2.4 titled "Interleaving". Each of these data segments begins with a three-bytes-long packet header consisting of a transport error indication (TEI) bit, payload start indicator bit, a transport priority bit, a 13-bits-long program (or packet) identification code (PID), two bits of scrambling control, two bits of adaptation field control, and a 4-bits-long continuity count.

In the (207, 187) R-S FEC codeword of FIG. 1, the three-bytes-long packet header is followed by a 184-bytes-long payload field, which in accordance with an aspect of the invention is filled with anti-Gray coded ancillary data. The FIG. 1 (207, 187) R-S FEC codeword concludes with twenty parity bytes. The PID of the FIG. 1 (207, 187) R-S FEC codeword is composed of thirteen ONEs, so legacy DTV receivers will disregard their respective reproductions of the data segment. Alternatively, the PID may have some other value that causes legacy DTV receivers to disregard their respective reproductions of the data segment.

In each of the (207, 187) R-S FEC codewords of FIGS. 2, 3 and 4, the three-bytes-long packet header is followed by a three-bytes-long adaptation field header, the first two bytes of which are specified by MPEG-2 protocol and the third byte of which is specified by an ATSC protocol. In each of the (207, 187) R-S FEC codewords of FIGS. 2, 3 and 4, the adaptation field header is followed by an adaptation field, which in accordance with the invention has anti-Gray coded ancillary data therewithin.

In the FIG. 2 (207, 187) R-S FEC codeword, the adaptation field header is followed by an adaptation field that is 181 bytes long and is filled with anti-Gray coded ancillary data. The FIG. 2 (207, 187) R-S FEC codeword concludes with twenty parity bytes for the Reed-Solomon coding.

In the FIG. 3 (207, 187) R-S FEC codeword, the adaptation field header is followed by an adaptation field that is M bytes long, M being less than 181. The M-bytes-long adaptation field is filled with anti-Gray coded ancillary data and is followed by a payload field that is N=(181−M) bytes long. The FIG. 3 (207, 187) R-S FEC codeword concludes with twenty parity bytes for the Reed-Solomon coding.

In the FIG. 4 (207, 187) R-S FEC codeword, the adaptation field header is followed by an adaptation field that is M bytes long, M being less than 181. The adaptation field includes twenty parity bytes for the Reed-Solomon coding, but is otherwise filled with anti-Gray coded ancillary data. The FIG. 4 (207, 187) R-S FEC codeword concludes with a payload field that is N=(181−M) bytes long. In some cases the payload field includes some anti-Gray coded ancillary data, in which cases the PID of the FIG. 4 (207, 187) R-S FEC codeword should be such that legacy DTV receivers will disregard their respective reproductions of the data segment. The PID of such FIG. 4 (207, 187) R-S FEC codewords is composed of thirteen ONEs, for example. The FIG. 4 (207, 187) R-S FEC codeword can be used to accommodate symbol sequences used to facilitate adaptive equalization in DTV receivers, for example.

FIG. 5 shows a service multiplexer 1 for ordinary 8VSB data. The service multiplexer 1 is connected for time-division multiplexing 187-byte MPEG-2-compatible data packets from an audio/video codec 2 and from a PSIP/PSI generator 3. The codec 2 and PSIP/PSI generator 3 are associated with the transmission of ordinary 8VSB data. If turbo code is transmitted using AVSB, at least selected ones if not all of the MPEG-2-compatible data packets from the audio/video codec 2 will have placeholder bytes inserted into adaptation fields introduced therewithin. These placeholder bytes will subsequently be replaced by bytes of turbo code components. The service multiplexer 1 is further connected for applying the time-division multiplexed MPEG-2-compatible data packets to a data randomizer 4 to be exclusive-ORed with portions of a pseudo-random binary sequence (PRBS) prescribed in A/53, Annex D, §4.2.2 titled "Data randomizer". The data randomizer 4 is connected for supplying the resulting randomized 187-byte MPEG-2-compatible data packets to an adaptation field stuffer 5 that stuffs turbo data into the adaptation fields of certain of those packets.

FIG. 5 shows a service multiplexer 6 for ancillary data. The service multiplexer 6 is connected for time-division multiplexing MPEG-2-compatible data packets from an audio/video codec 7 and from a PSIP/PSI generator 8. The codec 7 and PSIP/PSI generator 8 are associated with the transmission of ancillary data that are turbo coded. With regard to the PSIP/PSI generators 3 and 8, the acronym PSIP stands for Programme Specification Information Protocol, and the acronym PSI stands for Programme Specification Information. The service multiplexer 6 is further connected for applying the time-division multiplexed MPEG-2-compatible data packets to a data randomizer 9 to be exclusive-ORed with portions of the PRBS prescribed in A/53, Annex D, §4.2.2.

The data randomizer 9 is connected for supplying the randomized 187-byte MPEG-2-compatible data packets to an encoder 10 for (207, 187) Reed-Solomon forward-error-correction coding, as prescribed in A/53, Annex D, §4.2.3 titled "Reed-Solomon encoder". The (207, 187) R-S FEC coding will be utilized by DTV receivers of the sort shown in FIG. 14 to determine when the decoding of turbo coding regenerates one of the MPEG-2-compatible data packets from the audio/video codec 7 or from the PSIP/PSI generator 8.

The encoder 10 is connected for supplying the (207, 187) R-S FEC codewords that it generates to the encoder 11 for outer convolutional coding of the SCCC. The encoder 11 is connected for supplying the systematic outer codewords that it generates to a bit interleaver 12 for the bits of those systematic outer codewords. The interleaver 12 is connected for supplying the stream of interleaved bits it generates to a nibble recoder 13. In accordance with the invention, the nibble recoder 13 anti-Gray codes successive 2-bit nibbles of the received stream of interleaved bits to generate its response. The nibble recoder 13 is connected to supply that anti-Gray coded response to the adaptation field stuffer 5. The adaptation field stuffer 5 reproduces in its response the randomized 187-byte MPEG-2-compatible data packets from the data randomizer 4 except for replacing the placeholder bytes in the adaptation fields of selected ones of those data packets with anti-Gray coding from the nibble recoder 13.

The adaptation field stuffer 5 is connected for supplying its response comprising 187-byte packets to an encoder 14 that generates a respective (207, 187) Reed-Solomon forward-error-correction codeword in response to each of these packets. The encoder 14 is of the sort described in A/53, Annex D, §4.2.3 titled "Reed-Solomon encoder". The (207, 187) R-S FEC code encoder 14 is connected for supplying its 207-byte codewords to a convolutional byte interleaver 15 of the sort described in A/53, Annex D, §4.2.4 titled "Interleaving". The convolutional byte interleaver 15 is connected to supply the convolutionally interleaved bytes of the (207, 187) R-S FEC codewords to a 12-phase encoder 16 for ⅔ trellis code. The 12-phase encoder 16 is of the sort described in A/53, Annex D, §4.2.5 titled "Trellis coding" and supplies groups of three bits to an 8-level symbol mapper 17 as also described in §4.2.5. The 8-level symbol mapper 17 is customarily constructed using read-only memory (ROM). The mapper 17 is connected to supply 8-level symbols to a symbol code assembler 18 that inserts data segment synchronization (DSS) symbols and data field synchronization (DFS) symbols into the symbol stream before it is supplied to apparatus 19. The apparatus 19 combines the symbols with an offset to supply digital modulating signal to a vestigial-sideband amplitude-modulation (VSB AM) transmitter 20 for DTV signal. Subsequent to the adaptation field stuffer 5, the only difference from the transmitter practice prescribed by A/53 Annex D is the following. The reserved section of the DFS signal at the beginning of each data field contains a code sequence specifying the pattern of the ancillary (turbo-code) transmission in at least that field. FIG. 5 shows an encoder 21 connected for supplying these code sequences to the symbol code assembler 18.

In a modification of the FIG. 5 DTV transmitter apparatus as thus far described, the turbo coding occupies the 184-byte payload fields of 207-byte data segments, rather than being stuffed into adaptation fields within such data segments. In this modification of the FIG. 5 DTV transmitter apparatus, the adaptation field stuffer 5 is replaced by a payload field stuffer 5.

FIGS. 6 through 13 are tables of different forms of recoding that are suitable for use in the nibble recoder 13. The forms of recoding shown in FIGS. 6 and 11 each require minimal modification of the interleaved outer code supplied from the bit interleaver 12.

Figure 14:
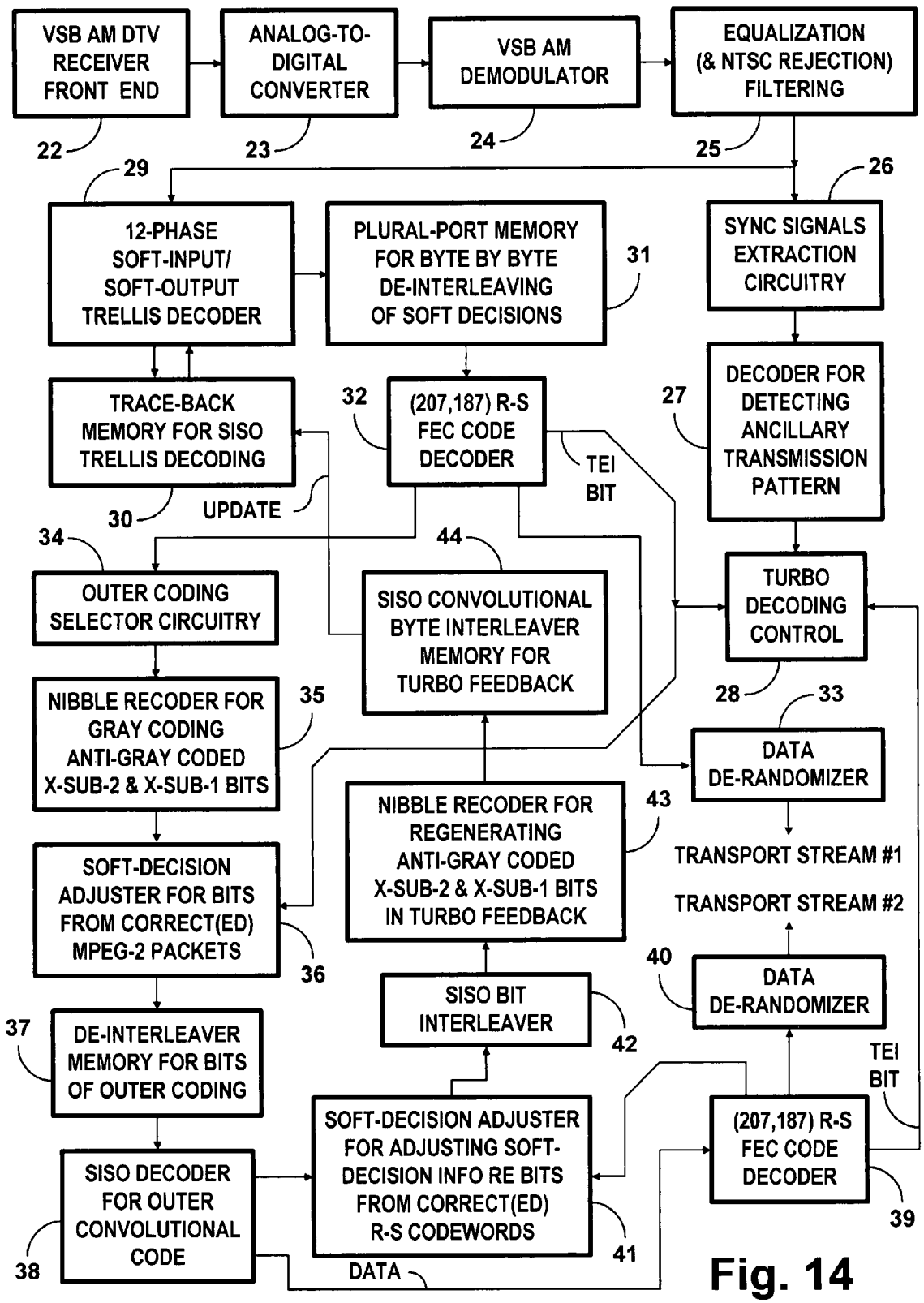
FIG. 14 is a general schematic diagram of receiver apparatus for broadcast digital television signals transmitted by transmitter apparatus of the sort shown in FIG. 5, which receiver apparatus embodies aspects of the invention and uses turbo decoding procedures.

FIG. 14 shows receiver apparatus for DTV signals transmitted by transmitter apparatus of the sort shown in FIG. 5. The FIG. 14 DTV receiver apparatus includes a vestigial-sideband amplitude-modulation (VSB AM) DTV receiver front-end 22 for selecting a radio-frequency DTV signal for reception, converting the selected RF DTV signal to an intermediate-frequency DTV signal, and for amplifying the IF DTV signal. An analog-to-digital converter 23 is connected for digitizing the amplified IF DTV signal supplied from the DTV receiver front-end 22. A demodulator 24 is connected for demodulating the digitized VSB AM IF DTV signal to generate a digitized baseband DTV signal, which is supplied to digital filtering 25 for equalization of channel response and for rejection of co-channel interfering NTSC signal. Synchronization signals extraction circuitry 26 is connected for receiving the digital filtering 25 response. Responsive to data-field-synchronization (DFS) signals, the sync signals extraction circuitry 26 detects the beginnings of data frames and fields. Responsive to data-segment-synchronization (DSS) signals, the sync signals extraction circuitry 26 detects the beginnings of data segments. The FIG. 14 DTV receiver apparatus uses the DSS and DFS signals for controlling its operations similarly to the way this is conventionally done in DTV receivers. FIG. 14 does not explicitly show the circuitry for effecting these operations. A decoder 27 for detecting the ancillary transmission pattern responds to the ancillary transmission pattern code contained in the reserved portions of DFS signals separated by the synchronization signals extraction circuitry 26. The decoder 27 is connected for supplying ancillary transmission pattern information to turbo decoding control circuitry 28 that controls turbo decoding in the FIG. 14 DTV receiver apparatus.

A 12-phase soft-input/soft-output trellis decoder 29 is connected for receiving the digital filtering 25 response. Traceback memory 30 is interconnected with the SISO trellis decoder 29 and is operated to provide temporary storage for soft decisions. Plural-port memory 31 is connected for receiving decoding results from the SISO trellis decoder 29 and providing byte-by-byte de-interleaving of those results to generate input signal for a Reed-Solomon decoder 32 of the de-interleaved (207, 187) R-S FEC codewords supplied from the de-interleaver 31. Preferably, the de-interleaved (207, 187) R-S FEC codewords are accompanied by soft-decision information, and the R-S decoder 32 is of a sort that can use the soft-decision information to improve overall performance of the decoders 29 and 32. The R-S decoder 32 is connected for supplying randomized data packets to a data de-randomizer 33, which exclusive-ORs the bits of the randomized data packets with appropriate portions of the PRBS prescribed in A/53, Annex D, §4.2.2 to generate de-randomized MPEG-2-compatible data packets of a first, principal transport stream. Insofar as the R-S decoder 32 is capable, it corrects the hard-decision 187-byte randomized data packets that it supplies to the data de-randomizer 33.

The R-S decoder 32 is further connected for supplying the turbo decoding control circuitry 28 indications of byte errors in the first transport stream. If the R-S decoder 32 finds a recovered data packet to be correct or corrects the recovered data packet, the turbo decoding control circuitry 28 will use this information to control the filling of subsequent buffer memory for the first transport stream. FIG. 10 does not show this subsequent buffer memory.

The R-S decoder 32 is also connected for supplying soft decisions concerning 187-byte data packets that have been corrected insofar as possible to outer coding selector circuitry 34 that selectively responds to the outer coding that is contained in adaptation fields of certain ones of those data packets to supply as output signal therefrom the input signal for a nibble recoder 35. The nibble recoder 35 is conveniently constructed using read-only memory (ROM). In accordance with an aspect of the invention, the nibble recoder 35 re-codes the reproduced $X_2$ and $X_1$ bits in each nibble to convert from anti-Gray code back to binary code. Insofar as the hard-decision portion of the nibble recoder 35 response is concerned, the re-coding is a Gray coding procedure. This Gray coding procedure uses the same one of the coding tables shown in FIGS. 6 through 13 as was used in the particular sort of FIG. 5 DTV transmitter apparatus transmitting DTV signal over the air to the FIG. 14 DTV receiver apparatus. Except for errors incurred in transmission and reception, the hard-decision portion of the nibble recoder 35 response reproduces the bit-interleaved outer coding from the interleaver 12 in the FIG. 5 DTV transmitter apparatus. The nibble recoder 35 also adjusts the respective soft-decision information in its response regarding each of the two bits in each successive nibble, to take into account the way in which the reproduced bit-interleaved outer coding maps against data slicing.

An "inner" soft-decision adjuster 36 is connected for adjusting the soft-decision information concerning each bit of the response from the nibble recoder 35, if the R-S decoder 32 found the 187-byte data packet the bit is from to have been correct, or was able to correct that R-S packet. This adjustment reflects the changed probabilities of various possible trellis codings of the bit being correct and can expedite subsequent turbo decoding procedure. The "inner" soft-decision adjuster 36 is connected to write the bits from the nibble recoder 35 together with associated soft-decision information to a soft-input/soft-output de-interleaver memory 37.

The de-interleaver memory 37 is read to supply soft-decision information about the outer convolutional coding generated by the encoder 11 in the FIG. 5 DTV transmitter apparatus. An outer soft-input/soft-output decoder 38 for the outer convolutional coding is connected to receive this soft-decision information. A Reed-Solomon decoder 39 is connected for receiving hard decisions from the outer SISO decoder 38 concerning (207, 187) R-S FEC-coded data. The R-S decoder 39 is further connected for supplying randomized data packets to a data de-randomizer 40. The data de-randomizer 40 exclusive-ORs the bits of the randomized data packets with appropriate portions of the PRBS prescribed in A/53, Annex D, §4.2.2 to generate de-randomized MPEG-2-compatible data packets of a second, ancillary transport stream.

The R-S decoder 39 is further connected for supplying the turbo decoding control circuitry 28 indications of byte errors in this second transport stream. If the R-S decoder 39 finds a recovered data packet to be correct or corrects the recovered data packet, the turbo decoding control circuitry 28 will discontinue further trying to correct that data packet. The turbo decoding control circuitry 28 keeps track of the number of decoding iterations for each packet in the turbo data field and the number of data packets that remain uncorrected. The turbo decoding control circuitry 28 uses this information to control the filling of subsequent buffer memory for the second transport stream. FIG. 14 does not show this subsequent buffer memory.

An "outer" soft-decision adjuster 41 is connected for adjusting the soft-decision information concerning each bit of ancillary data in the soft-decision response from the outer SISO decoder 38 which bit was contained within a 207-byte R-S codeword found correct or corrected by the R-S decoder 39. This adjustment reflects the altered probabilities of various possible trellis codings of the bit being correct and can expedite subsequent turbo decoding procedure. The "outer" soft-decision adjuster 41 supplies the adjusted soft-decision response of the outer SISO decoder 38 as input signal to a soft-input/soft-output bit interleaver 42. The bit interleaving performed by the SISO interleaver 42 is complementary to the bit de-interleaving performed when reading from the memory 37. The SISO interleaver 42 is connected to supply its response to a nibble recoder 43 as the input signal thereto.

In accordance with an aspect of the invention, the nibble recoder 43 anti-Gray codes the $X_2$ and $X_1$ bits in each nibble to convert from binary code to anti-Gray code. The re-coding uses the same one of the coding tables shown in FIGS. 6 through 13 as was used in the particular sort of FIG. 5 DTV transmitter apparatus transmitting DTV signal over the air to the FIG. 14 DTV receiver apparatus. Except for errors incurred in transmission and reception, the response from the nibble recoder 43 reproduces the outer convolutional coding generated by the encoder 11 in the FIG. 5 DTV transmitter apparatus, but with subsequent corrections, for writing to a convolutional byte interleaver memory 44.

Read-out signal from the convolutional byte interleaver memory 44 is used as turbo feedback to update the contents of the traceback memory 30 before the trellis decoder 29 attempts any further decoding of a data field already decoded. Such further decoding may be attempted after the successive decoding of all the data packets in the turbo field is completed. Such further decoding is then followed by decoding the data packets in the turbo field that thus far have not been decoded successfully, so as to generate corrected data packets. Still further iterations of the decoding procedures may be attempted in line with known turbo coding procedures.

The AVSB DTV broadcast system proposed by Samsung Electronics Co., Ltd. differs from the DTV broadcast system described above in that the outer convolutional coding is done raster scanning through the convolutionally byte interleaved data field, rather than through the data field before convolutional byte interleaving. This avoids convolutional byte interleaving affecting the bit interleaving employed after the outer convolutional coding in the serial concatenated convolutional coding (SCCC). The AVSB DTV broadcast system proposed by Samsung Electronics Co., Ltd. can be modified in accordance with the invention herein described, so as to anti-Gray code the SCCC.

Figure 15:
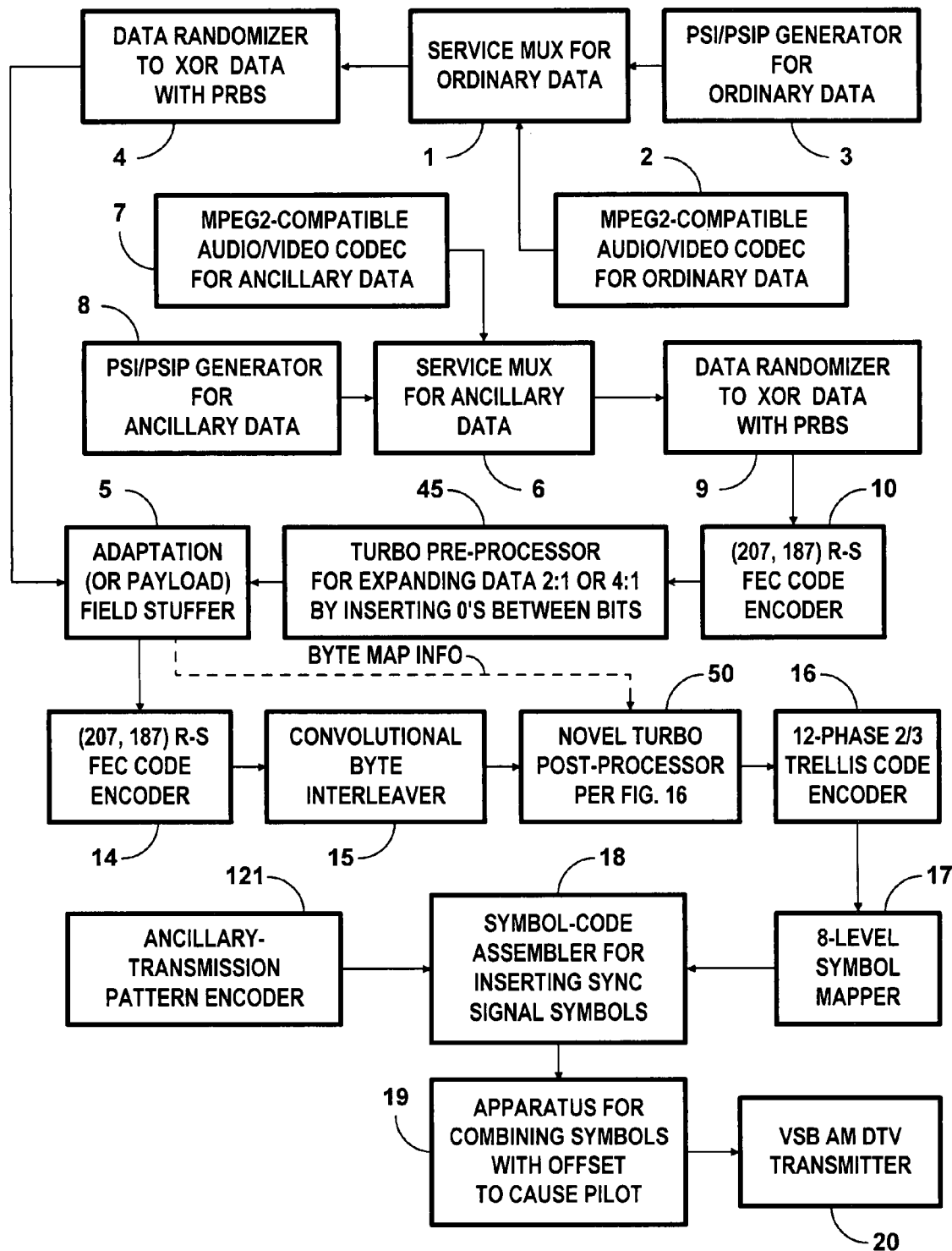
FIG. 15 is a general schematic diagram of transmitter apparatus for broadcast digital television signals using SCCC of AVSB type or the like, which transmitter apparatus includes a novel turbo post-processor in accordance with aspects of the invention.

FIG. 15 shows transmitter apparatus for broadcast digital television signals using turbo coding of AVSB type, or the like, in which the SCCC is anti-Gray coded. The FIG. 15 transmitter apparatus differs from the FIG. 5 transmitter apparatus in that the encoder 11, the bit interleaver 12 and the nibble recoder 13 are replaced by a turbo pre-processor 45. The FIG. 15 transmitter apparatus further differs from the FIG. 5 transmitter apparatus in that a turbo post-processor 50 is inserted between the convolutional byte interleaver 15 and the 12-phase encoder 16 for ⅔ trellis code. The encoding, the bit interleaving and the anti-Gray coding of the outer convolutional coding are done in the turbo post-processor 50 in the FIG. 15 transmitter apparatus. Except for these differences, the FIG. 15 transmitter apparatus is generally similar to the FIG. 5 transmitter apparatus The turbo pre-processor 45 expands the data supplied from the encoder 10 for (207, 187) R-S FEC coding two to one or, alternatively, four to one. Two-to-one expansion of the data from the encoder 10 is done by inserting a respective ZERO after each bit of data, thereby expanding each (207, 187) R-S FEC codeword into two 207-byte-long data segments. Four-to-one expansion of the data from the encoder 10 is done by inserting three respective ZEROes after each bit of data, thereby expanding each (207, 187) R-S FEC codeword into four 187-byte-long 207-byte-long data segments. The expanded data is supplied to the adaptation field stuffer 5 if AVSB protocol is followed. The adaptation field stuffer 5 is replaced by a payload field stuffer 5 in a variant of the FIG. 15 transmitter apparatus. FIG. 15 shows the adaptation field (or payload field) stuffer 5 supplying byte map information to the turbo post-processor 50 indicating which bytes in the 187-byte MPEG-2 data packets supplied to the encoder 14 for (207, 187) R-S FEC coding contain expanded data generated by the turbo pre-processor 45.

Figure 16:
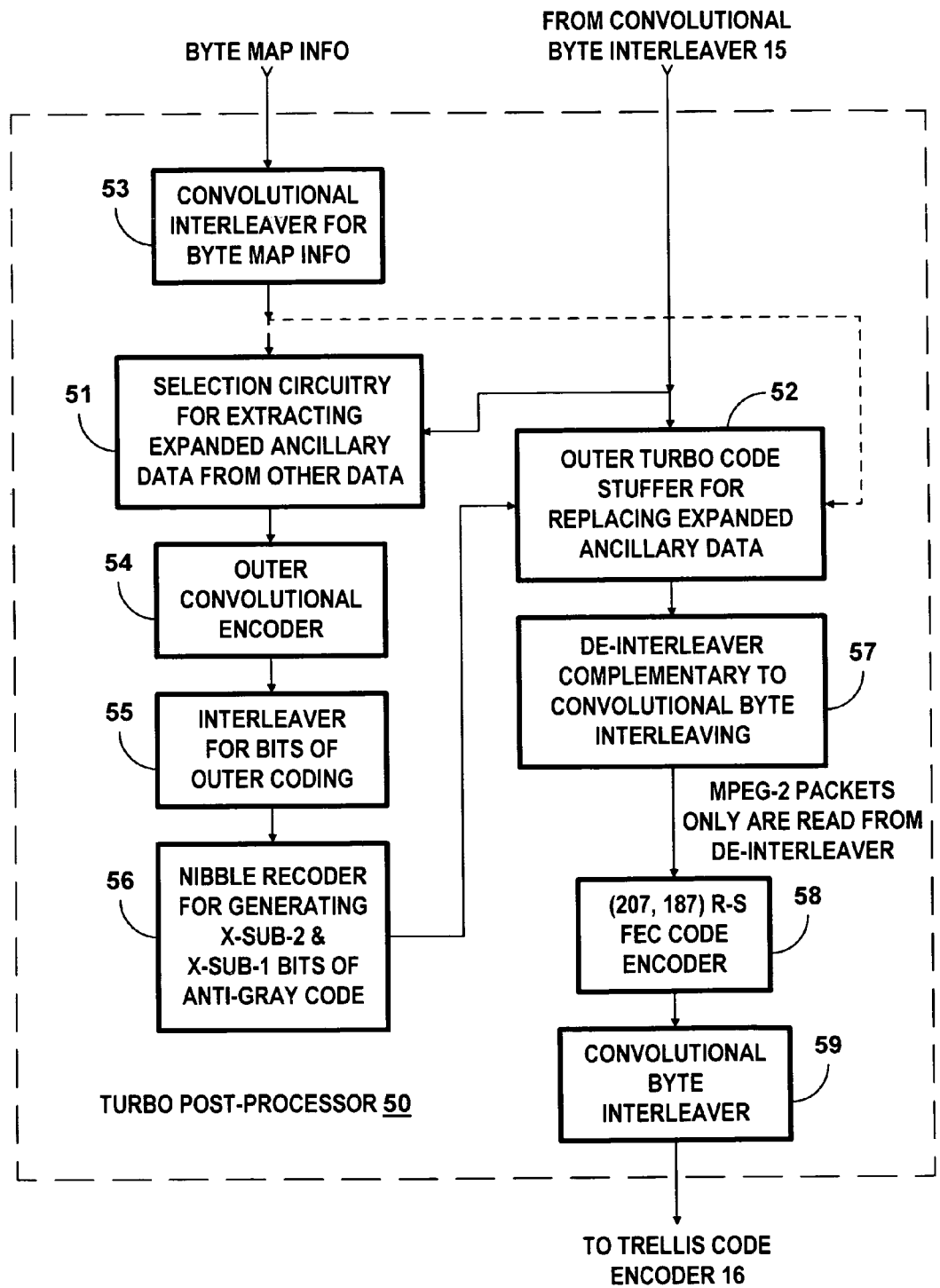
FIG. 16 is a schematic diagram showing in more detail the novel turbo post-processor included in the FIG. 15 transmitter apparatus.

FIG. 16 shows in detail a possible construction for the turbo post-processor 50 comprising elements 51, 52, 53, 54, 55, 56, 57, 58 and 59. The response of the convolutional byte interleaver 15 is supplied as input signal to the turbo post-processor 50. The response of the convolutional byte interleaver 15 is applied as input signal to selection circuitry 51 connected for extracting the expanded ancillary data from other data in the response of the convolutional byte interleaver 15. The response of the convolutional byte interleaver 15 is applied as a first input signal to an outer turbo code stuffer 52 for generating an output signal that reproduces the response of the convolutional byte interleaver 15 in part, but replaces the expanded ancillary data with recoded outer turbo code.

The byte map information indicating which bytes in the 187-byte MPEG-2 data packets supplied to the R-S encoder 14 contain expanded data is supplied to a convolutional interleaver 53 for byte map information. The indications of which bytes in each of the 187-byte MPEG-2 data packets supplied to the R-S encoder 14 contain expanded data are extended by indications of 20 parity bytes of (207, 187) R-S FEC coding in the convolutional interleaver 53 for byte map information. This generates indications of which bytes in each of the (207, 187) R-S FEC codewords supplied from the R-S encoder 14 contain expanded data. The convolutional interleaver 53 for byte map information convolutionally interleaves these indications to obtain indications of which bytes in the response of the convolutional byte interleaver 15 contain expanded data. These indications provide control signals to the selection circuitry 51 and to the outer turbo code stuffer 52 to govern their respective operations. In practice, the convolutional byte interleaver 15 and the convolutional interleaver 51 for byte map information can be realized in a single dual-port random-access memory (RAM) using circuitry for write addressing and read addressing in common. The indications of R-S parity bytes in the convolutional interleaver 53 part of the RAM can be hard-wired to be read-only.

FIG. 16 shows the selection circuitry 51 connected for extracting the expanded ancillary data from other data in the response of the convolutional byte interleaver 15, which extraction is controlled by the interleaved byte map information supplied from the convolutional interleaver 53 for byte map information. The selection circuitry 51 is further connected for supplying the expanded ancillary data it extracts to an outer convolutional encoder 54 for SCCC, which encoder 54 convolutionally codes the expanded ancillary data to generate its response. The outer convolutional encoder 54 is connected for supplying its response as input signal to an interleaver 55 for the bits of the convolutional outer coding.

The interleaver 55 is connected for supplying interleaved convolutional outer coding generated in response to its input signal to a nibble recoder 56, which is the novel element in the turbo post-processor 50 that implements an aspect of the invention. The nibble recoder 56 recodes each 2-bit nibble of the interleaved convolutional outer coding to generate a respective pair of $X_1$ and $X_2$ bits that are anti-Gray coded. The resulting anti-Gray code is supplied by the nibble recoder 56 to the outer turbo code stuffer 52 as a second input signal for replacing the expanded ancillary data in the response of the outer turbo code stuffer 52 to the response of the convolutional byte interleaver 15.

The response of the outer turbo code stuffer 52 is supplied to a de-interleaver 57 performing de-interleaving complementary to the interleaving done by the convolutional byte interleaver 15. If deterministic trellis resetting (DTR) is used, the modifications of $X_1$ bits are fed back to the memory used in the de-interleaver 57. The bytes of the 187-byte MPEG-2-compatible data packets that appear in the de-interleaver 57 response are supplied to an encoder 58 that generates a respective (207, 187) Reed-Solomon forward-error-correction codeword in response to each of these packets. These (207, 187) R-S FEC codewords take into account the changes made in the packets owing to the substitution of recoded outer turbo coding for the expanded ancillary data by the outer turbo code stuffer 52 and owing to DTR. The R-S encoder 58 is of the sort described in A/53, Annex D, §4.2.3 titled "Reed-Solomon encoder". A convolutional byte interleaver 59 is connected for convolutionally interleaving the (207, 187) R-S FEC codewords supplied from the R-S encoder 58 to generate the output signal supplied from the turbo post-processor 50 to the trellis code encoder 16 as input signal thereto.

FIG. 16 does not explicitly show the shim delay that must be introduced into the first input signal for the outer turbo code stuffer 52 to compensate for the combined latent delay in the path through the selection circuitry 51, the turbo outer encoder 54, the bit interleaver 55 and the nibble recoder 56. FIG. 16 does not explicitly show the shim delay that must be introduced into the bit map information to compensate for the latent delay through the R-S encoder 14. The (207, 187) R-S FEC coding by the encoder 14 of the FIG. 16 transmitter apparatus is discarded later on, after the de-interleaver 57 in the turbo post-processor 50. So, the FIG. 16 transmitter apparatus can be modified to replace the encoder 14 with simple zero extension of the MPEG-2-compatible packets supplied from the adaptation (or payload) field stuffer 5. The byte map information can be extended accordingly. This avoids having to introduce a substantial amount of shim delay into the byte map information to compensate for the substantial latent delay associated with (207, 187) R-S FEC coding.

Figure 17:
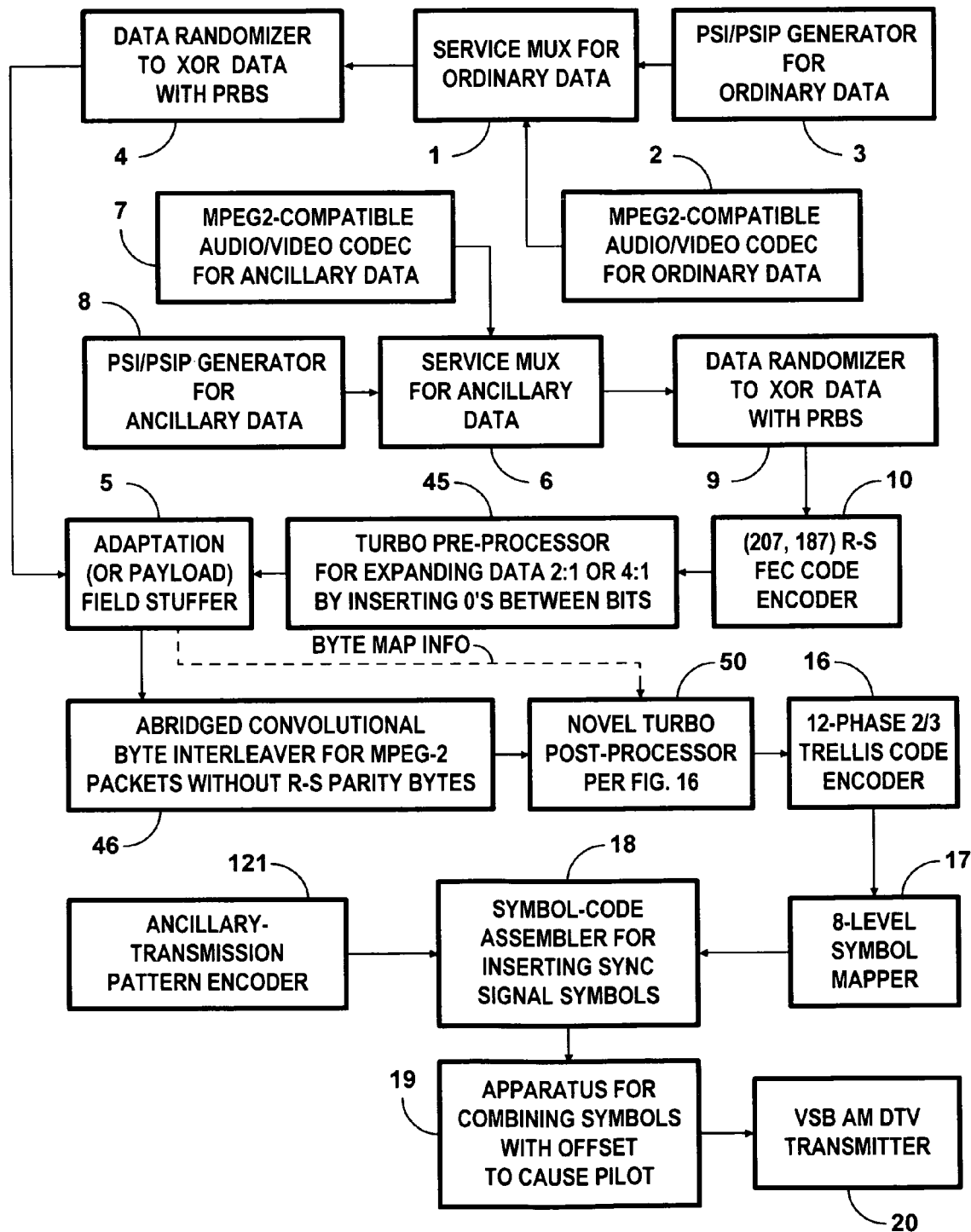
FIG. 17 is a general schematic diagram of modified FIG. 15 transmitter apparatus, which modified transmitter apparatus includes the FIG. 16 turbo post-processor in accordance with aspects of the invention.

FIG. 17 shows DTV transmitter apparatus that is modified in a slightly different way to avoid having to introduce a substantial amount of shim delay into the byte map information to compensate for the substantial latent delay associated with (207, 187) R-S FEC coding. The cascade connection of the R-S encoder 14 and the convolutional byte interleaver 15 is replaced by an abridged convolutional byte interleaver 46. The abridged convolutional byte interleaver 46 is connected for receiving, as its input signal, the MPEG-2-compatible packets supplied from the adaptation (or payload) field stuffer 5. The memory used in the abridged convolutional byte interleaver 46 replaces the storage locations that would be used for temporarily storing parity bytes for (207, 187) R-S FEC coding with read-only storage locations hard-wired to supply null bytes. The output port of the abridged convolutional byte interleaver 46 connects directly to the input port of the turbo post-processor 50 in the FIG. 17 DTV transmitter apparatus.

Figure 18:
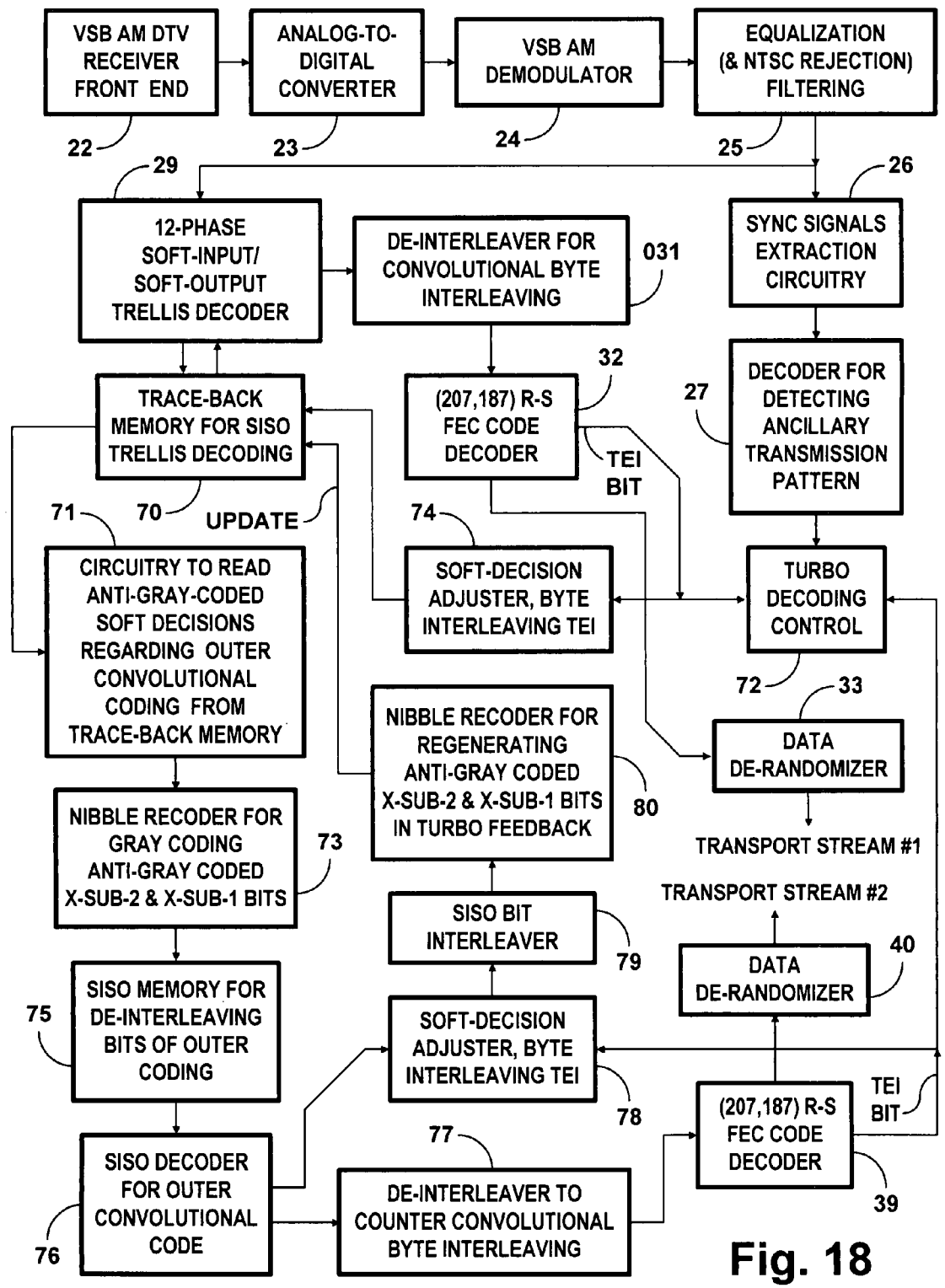
FIG. 18 is a general schematic diagram of receiver apparatus for broadcast digital television signals using SCCC of AVSB type or the like, as transmitted by transmitter apparatus of the sort shown in FIGS. 15 and 16 or shown in FIGS. 16 and 17, which receiver apparatus embodies aspects of the invention and uses turbo decoding procedures.

FIG. 18 shows receiver apparatus for DTV signals transmitted by transmitter apparatus of the sort shown in FIGS. 15 and 16, or of the sort shown in FIGS. 17 and 16. The FIG. 18 DTV receiver apparatus includes the elements 22, 23, 24, 25, 26, 27, 29, 31, 32 and 32, which are connected and operated the same way as in the FIG. 14 DTV receiver apparatus. The trace-back memory 30 of the 12-phase SISO trellis decoder 29 of the FIG. 14 DTV receiver apparatus is replaced in the FIG. 18 DTV receiver apparatus by trace-back memory 70 from which anti-Gray-coded soft decisions regarding outer convolutional coding can be read directly via circuitry 71. The decoder 27 is connected for supplying ancillary transmission pattern information to turbo decoding control circuitry 72 that controls turbo decoding in the FIG. 18 DTV receiver apparatus. The turbo decoding control circuitry 72 is connected for supplying control signals to the circuitry 71 directing the reading of anti-Gray-coded soft decisions regarding outer convolutional coding therefrom to a nibble recoder 73. The nibble recoder 73 is conveniently constructed using ROM.

In accordance with an aspect of the invention, the nibble recoder 73 Gray codes nibbles of the hard decisions contained in the soft-decision information, each of which nibbles consists of a respective reproduced $X_2$ leading bit and a respective reproduced $X_1$ trailing bit. The Gray coding converts the reproduced $X_2$ and $X_1$ bits in each nibble from anti-Gray code back to binary code. This Gray coding procedure uses the same one of the coding tables shown in FIGS. 6 through 13 as was used in the FIG. 16 portion of the FIG. 15 or FIG. 17 DTV transmitter apparatus transmitting DTV signal over the air to the FIG. 18 DTV receiver apparatus. Except for errors incurred in transmission and reception, the hard-decision portion of the nibble recoder 73 response reproduces the bit-interleaved outer coding from the interleaver 55 in the FIG. 16 portion of the DTV transmitter apparatus of FIG. 15 or FIG. 17. The nibble recoder 73 also adjusts the respective soft-decision information in its response regarding each of the two bits in a nibble, to take into account the way in which the reproduced bit-interleaved outer coding maps against data slicing.

An "inner" soft-decision adjuster 74 is arranged to adjust the soft-decision information concerning bits temporarily stored in the trace-back memory 70 that the R-S decoder 32 has found to be in a correct(ed) R-S FEC codeword. The transport error indication from the R-S decoder 32 is extended to fill a data segment and is convolutionally byte interleaved to generate indications of which locations in the trace-back memory 70 contain bits that the R-S decoder 32 has found are presumably correct. The soft-decision adjuster 74 reads, adjusts and re-writes the soft-decision information that the trace-back memory 70 temporarily stores concerning these bits that are presumably correct. This procedure is done so as to reflect the higher probability that these particular bits are presumably correct. The adjusted soft-decision information will be exploited in subsequent iterations of the turbo decoding procedures. The "inner" soft-decision adjuster 74 responds to the transport error indications from the R-S decoder 32 to adjust both the soft-decision information concerning bits of ancillary data and the soft-decision information concerning parity bits of the outer convolutional coding.

A soft-input/soft-output memory 75 is connected for being written with the nibble recoder 73 response. Responsive to write-addressing and read-addressing control signals from the turbo decoding control circuitry 72, supplied via connections not explicitly shown in FIG. 18, the SISO memory 75 is operated as a bit de-interleaver for the bit interleaving of the outer convolutional coding. The SISO memory 75 is connected for reading soft decisions concerning outer convolutional coding to a soft-input/soft-output decoder 76 for the outer convolutional coding of the SCCC.

The SISO decoder 76 for outer convolutional coding is connected to supply a de-interleaver 77 with hard decisions as to interleaved Reed-Solomon-coded ancillary data. The de-interleaver 77 counters in its response the convolutional byte interleaving done by the interleaver 59 in the turbo post-processor 50 of the DTV transmitter apparatus of FIG. 15 or of FIG. 17. The de-interleaver 77 is connected for supplying its response as input signal to the decoder 39 for (207, 187) R-S FEC codewords. The R-S decoder 39 is connected for supplying hard-decisions about data packets from correct(ed) R-S FEC codewords to the data de-randomizer 40 as input signal thereto. The data randomizer 40 generates a second transport stream containing 187-byte MPG-2-compatible packets of ancillary data.

FIG. 18 shows the R-S decoder 39 connected for supplying the turbo decoding control circuitry 72 an indication when the decoder 39 is unable to correct any particular one of the (207, 187) R-S FEC codewords it receives from the de-interleaver 76. If the R-S decoder 39 finds a recovered data packet to be correct or corrects the recovered data packet, the turbo decoding control circuitry 72 will discontinue further trying to correct that data packet. The turbo decoding control circuitry 72 keeps track of the number of decoding iterations for each packet in the turbo data field and the number of data packets that remain uncorrected. The turbo decoding control circuitry 72 uses this information to control the filling of subsequent buffer memory for the second transport stream. FIG. 18 does not show this subsequent buffer memory.

An "outer" soft-decision adjuster 78 is connected for adjusting the soft-decision information concerning each bit of ancillary data in the soft-decision response from the outer SISO decoder 76 which bit was contained within a 207-byte R-S codeword found correct or corrected by the R-S decoder 39. This adjustment reflects the altered probabilities of various possible trellis codings of the bit being correct and can expedite subsequent turbo decoding procedure. The "outer" soft-decision adjuster 78 supplies the adjusted soft-decision response of the outer SISO decoder 76 as input signal to a soft-input/soft-output bit interleaver 79. The bit interleaving performed by the SISO interleaver 79 is complementary to the bit de-interleaving performed when reading from the memory 75. The SISO interleaver 79 is connected to supply its response to a nibble recoder 80 as the input signal thereto.

In accordance with an aspect of the invention, the nibble recoder 80 anti-Gray codes the $X_2$ and $X_1$ bits in each nibble to convert from binary code to anti-Gray code. The re-coding uses the same one of the coding tables shown in FIGS. 6 through 13 as was used in the particular sort of FIG. 15 or FIG. 17 DTV transmitter apparatus transmitting DTV signal over the air to the FIG. 18 DTV receiver apparatus. Except for errors incurred in transmission and reception, the response from the nibble recoder 80 reproduces the outer convolutional coding from the encoder 54 in the FIG. 16 DTV turbo post-processor of the FIG. 15 or FIG. 17 transmitter apparatus, but with subsequent corrections.

The response from the nibble recoder 80 is used as turbo feedback to update the contents of the traceback memory 70 before the trellis decoder 29 attempts any further decoding of a data field already decoded. Such further decoding may be attempted after the successive decoding of all the data packets in the turbo field is completed. Such further decoding is then followed by decoding the data packets in the turbo field that thus far have not been decoded successfully, so as to generate corrected data packets. Still further iterations of the decoding procedures may be attempted in line with known turbo coding procedures.

Figure 19:
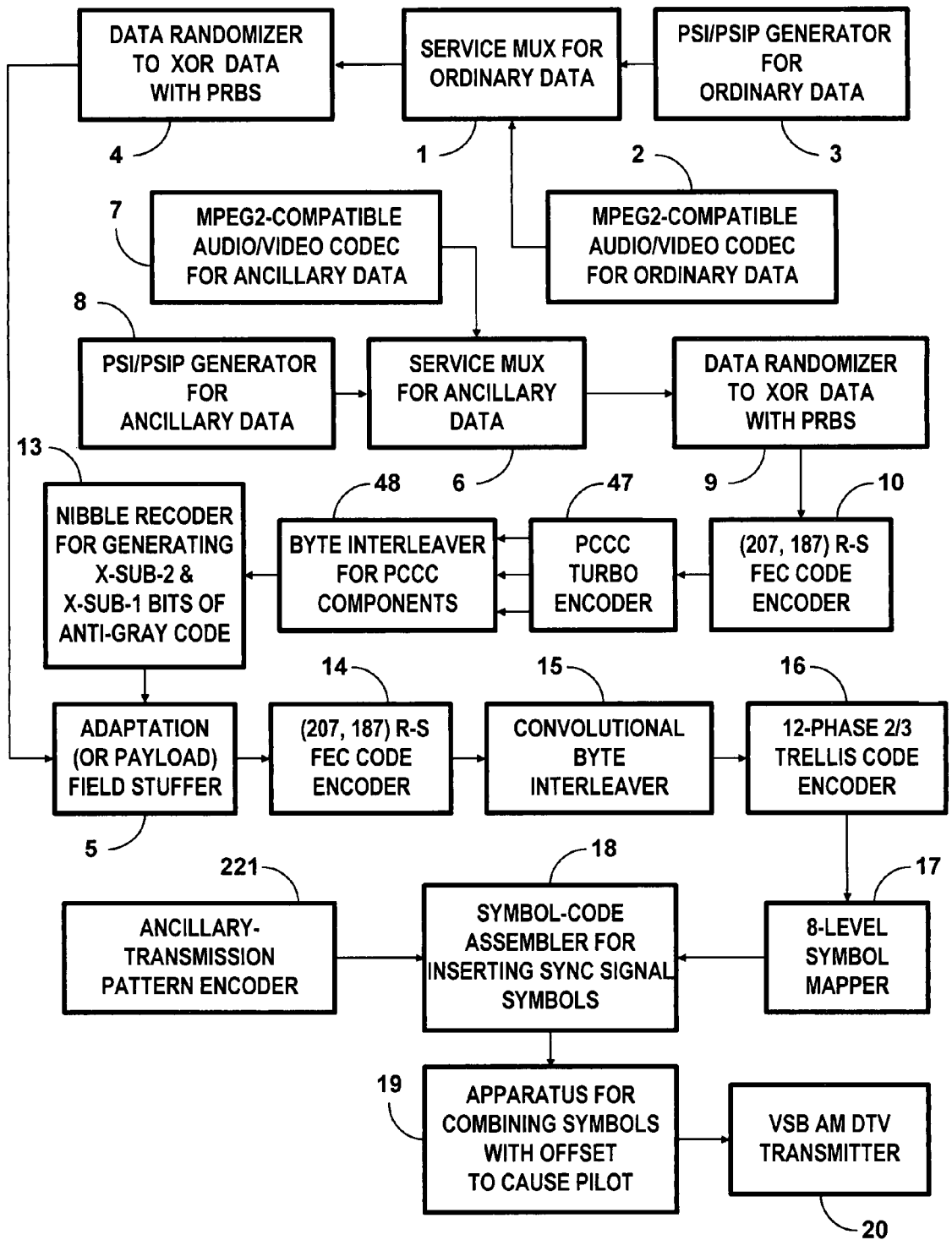
FIG. 19 is a general schematic diagram of transmitter apparatus for broadcast digital television signals using parallelly concatenated convolutional coding (PCCC), which transmitter apparatus embodies aspects of the invention.

FIG. 19 shows transmitter apparatus for broadcast digital television signals using parallelly concatenated convolutional coding (PCCC) of the ancillary data, which is followed by ⅔ trellis coding in serial further concatenation. The FIG. 19 transmitter apparatus differs from the FIG. 5 transmitter apparatus in that the encoder 11 and the bit interleaver 12 for outer convolutional coding are replaced by a PCCC turbo encoder 47 and a byte interleaver 48 for PCCC components. Otherwise, the FIG. 19 transmitter apparatus is generally similar to the FIG. 5 transmitter apparatus, with the nibble recoder 13 remaining a novel feature of primary interest with regard to an aspect of the invention.

By way of specific example, FIG. 19 is drawn considering the PCCC turbo encoder 47 to be of a type that generates, in addition to a first component code consisting of a bitstream of original data bits, second and third component codes consisting of respective bitstreams of two different sets of parity. The word lengths of these component codes are conveniently made a small multiple of 207 bytes that is a small multiple of the number of bytes in each of the MPEG-2-packet fields that the words are to be stuffed into. E.g., eight (207, 187) R-S FEC codewords may generate enough PCCC to fill payload fields in twenty-seven MPEG-2-compatible data packets. The byte interleaver 48 interleaves bytes of the three component codes to generate PCCC codewords, which PCCC codewords in some embodiments of transmitter apparatus per FIG. 19 are supplied directly to the nibble recoder 13 as input signal. The byte interleaver 48 in some embodiments of transmitter apparatus per FIG. 19 will generate input signal for the nibble recoder 13 by further interleaving the PCCC codewords. The further interleaving can be block interleaving of commonplace matrix type or of the type described by P. M. P. Spruyt in U.S. Pat. No. 5,907,560 issued 25 May 1999 and titled "Method for interleaving data frames, forward error correcting device and modulator including such a device". Such block interleaving can arrange PCCC codewords transversely to the adaptation or payload fields of the MPEG-2-compatible data packets that the PCCC codewords are stuffed into. This avoids undesirable interaction of the convolutional byte interleaving prescribed by A/53 with the PCCC codewords.

Figure 20:
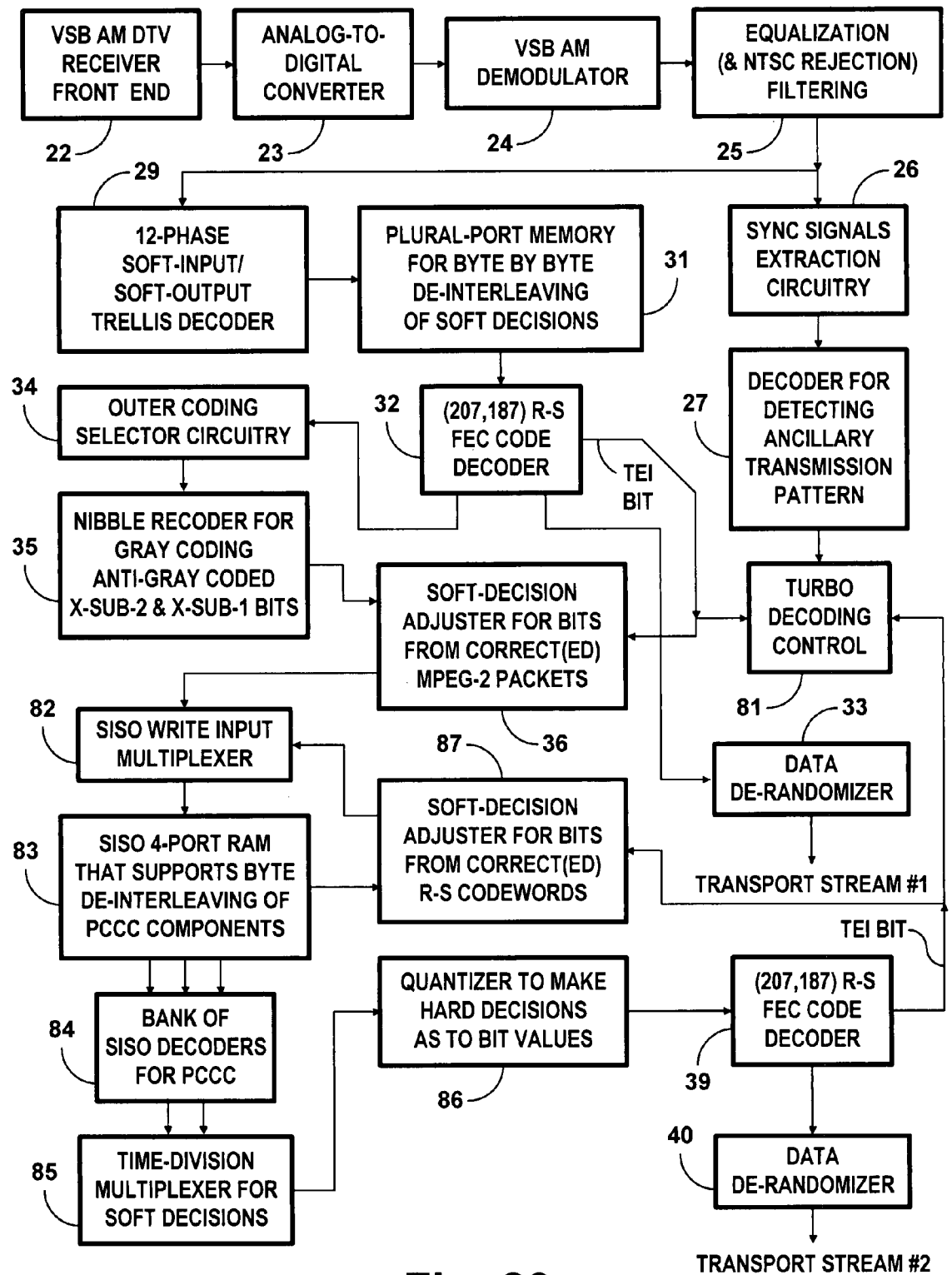
FIG. 20 is a general schematic diagram of receiver apparatus for broadcast digital television signals using PCCC, as transmitted by transmitter apparatus of the sort shown in FIG. 19, which receiver apparatus embodies aspects of the invention and uses turbo decoding procedures.

FIG. 20 shows receiver apparatus for broadcast digital television signals using PCCC, as transmitted by transmitter apparatus of the sort shown in FIG. 19, which receiver apparatus uses turbo decoding procedures. The FIG. 20 DTV receiver apparatus includes the elements 22, 23, 24, 25, 26, 27, 29, 31, 32, 33, 34 and 35, which are connected and operated much the same way as in the FIG. 14 DTV receiver apparatus. The decoder 27 is connected for supplying ancillary transmission pattern information to turbo decoding control circuitry 81 that controls turbo decoding in the FIG. 22 DTV receiver apparatus. The turbo decoding control circuitry 81 is connected for supplying control signals to the outer coding selector circuitry 34 directing the reading of anti-Gray-coded soft decisions regarding PCC to the nibble recoder 35. The nibble recoder 35 remains a novel feature of primary interest with regard to an aspect of the invention. The "inner" soft-decision adjuster 36 is connected for adjusting the soft-decision information concerning each bit of the response from the nibble recoder 35, if the R-S decoder 32 found the 187-byte data packet the bit is from to have been correct, or was able to correct that R-S packet. This adjustment reflects the changed probabilities of various possible trellis codings of the bit being correct and can expedite subsequent turbo decoding procedure. The "inner" soft-decision adjuster 36 is connected to supply the bits from the nibble recoder 35 together with associated soft-decision information to a first input port of a soft-input/soft-output write-input multiplexer 82. The output port of the SISO write-input multiplexer 82 connects to a random-access write-input port of a 4-port random-access memory 83 that supports byte de-interleaving of soft-decision information about the component signals of PCCC.

More particularly, the random-access memory 83 is operated under control of the turbo decoding control circuitry 81 for de-interleaving soft-decision information regarding bytes in a manner that is complementary to the interleaving of bytes of the component signals of PCCC that was done by the byte interleaver 48 in the FIG. 19 DTV transmitter apparatus. The RAM 83 has three serial read-output ports that supply the three component signals of PCCC at suitable times to ones of a bank 84 of soft-input/soft-output decoders for PCCC. A time-division multiplexer 85 is connected for supplying soft-decisions from the soft-input/soft-output decoders for PCCC in the bank 84 to a quantizer 86 that responsive to these soft-decisions makes hard decisions concerning decoded ancillary data. The quantizer 86 is connected to supply hard decisions as to the (207, 187) Reed-Solomon-coded ancillary data to the decoder 39 for (207, 187) R-S FEC codewords.

FIG. 20 shows the R-S decoder 39 connected for supplying the turbo decoding control circuitry 81 an indication when the decoder 39 is unable to correct any particular one of the (207, 187) R-S FEC codewords it receives from the quantizer 86. If the R-S decoder 39 finds a recovered data packet to be correct or corrects the recovered data packet, the turbo decoding control circuitry 81 will discontinue further trying to correct that data packet. The turbo decoding control circuitry 81 keeps track of the number of decoding iterations for each packet in the turbo data field and the number of data packets that remain uncorrected. The turbo decoding control circuitry 81 uses this information to control the filling of subsequent buffer memory for the second transport stream. FIG. 20 does not show this subsequent buffer memory.

An "outer" soft-decision adjuster 87 is connected for adjusting the soft-decision information concerning each bit of ancillary data stored in the RAM 83 which bit was contained within a 207-byte R-S codeword found correct or corrected by the R-S decoder 39. This adjustment reflects the altered probabilities of various possible trellis codings of the bit being correct and can expedite subsequent turbo decoding procedure.

Figure 21:
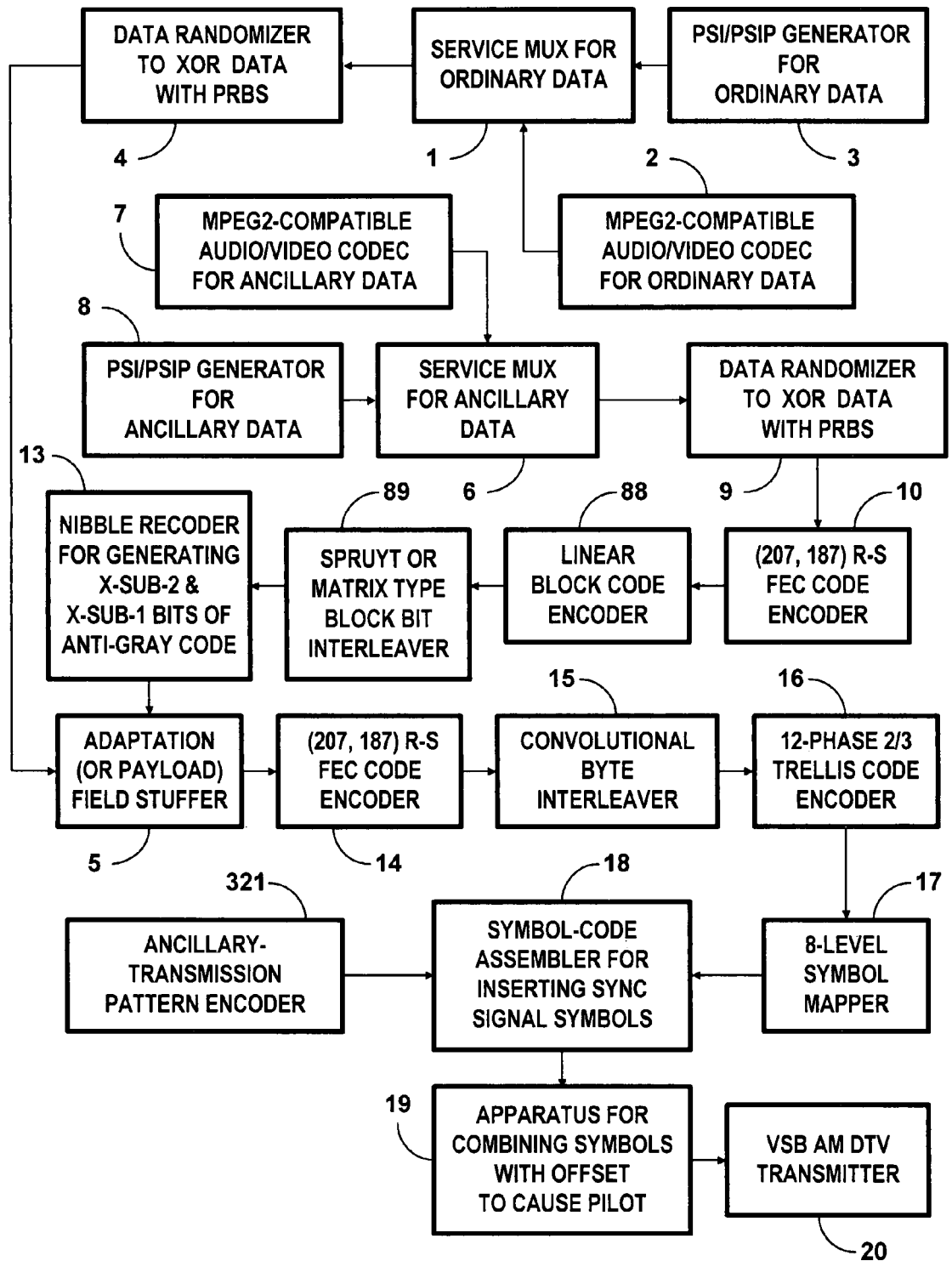
FIG. 21 is a general schematic diagram of transmitter apparatus for broadcast digital television signals using serially concatenated coding (SCC) that follows linear block coding (LBC) with convolutional ⅔ trellis coding, which transmitter apparatus embodies aspects of the invention.

FIG. 21 shows transmitter apparatus for broadcast digital television signals using serially concatenated coding (SCC) that follows linear block coding (LBC) with convolutional ⅔ trellis coding. The FIG. 19 transmitter apparatus differs from the FIG. 5 transmitter apparatus in that the encoder 11 and the bit interleaver 12 for outer convolutional coding are replaced by an encoder 88 and a block bit interleaver 89 for linear block coding. Otherwise, the FIG. 21 transmitter apparatus is generally similar to the FIG. 5 transmitter apparatus, with the nibble recoder 13 remaining a novel feature of primary interest with regard to an aspect of the invention. The LBC encoder 88 is a (23, 12) binary Golay encoder in one embodiment of the FIG. 21 DTV transmitter apparatus and a (24, 12) extended binary Golay encoder in another embodiment of the FIG. 21 DTV transmitter apparatus. In still other embodiments of the FIG. 21 DTV transmitter apparatus the LBC encoder 88 respectively employs an (8, 4) code, a (16, 8) code, a (15, 8) Hamming code, and a (12, 8) code, which codes are useful in locating errors when decoding (207, 187) R-S FEC codewords generated by the R-S encoder 10. Suitable (8, 4) and (16, 8) codes are described by A. L. R. Limberg in U.S. Pub. Pat. App. 2006-0245505-A1 published 2 Nov. 2006 and titled "Digital television signals using linear block coding", with reference to FIGS. 17 to 20 of its drawing. A suitable (12, 8) code is described by A. L. R. Limberg in U.S. patent application Ser. No. 11/785,000 filed 10 Apr. 2007 and titled "Robust DTV signals transmitted at two thirds the code rate of ordinary 8VSB DTV signals", with reference to FIGS. 3 to 7 of its drawing. The block bit interleaver 89 may be of commonplace matrix type or of the type described by P. M. P. Spruyt in U.S. Pat. No. 5,907,560.

Figure 22:
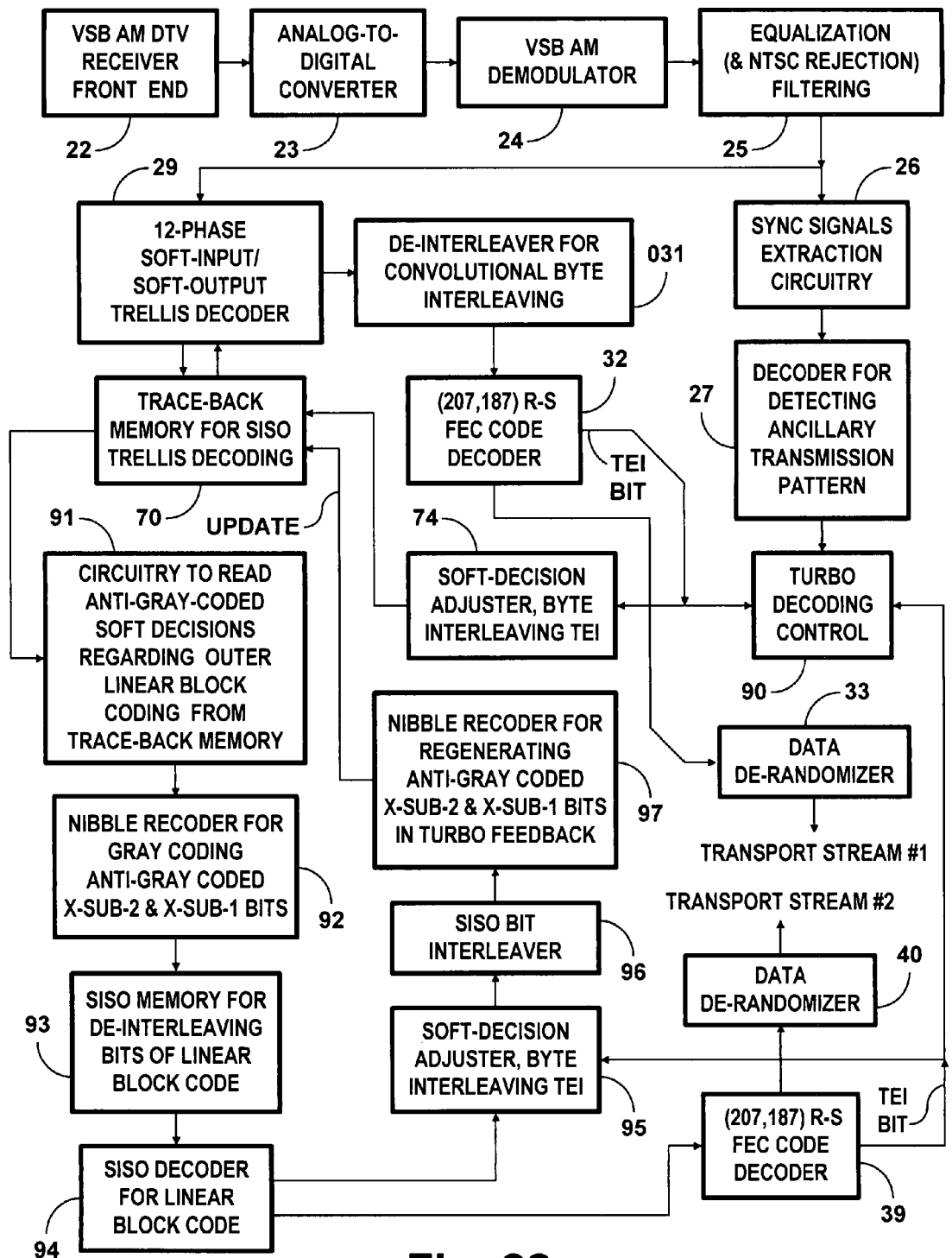
FIG. 22 is a general schematic diagram of receiver apparatus for broadcast digital television signals using SCC, as transmitted by transmitter apparatus of the sort shown in FIG. 21, which receiver apparatus embodies aspects of the invention.

FIG. 22 is a general schematic diagram of receiver apparatus for broadcast digital television signals using SCC, as transmitted by transmitter apparatus of the sort shown in FIG. 21, which receiver apparatus embodies an aspect of the invention. The FIG. 22 DTV receiver apparatus includes the elements 22, 23, 24, 25, 26, 27, 29, 31, 32 and 33, which are connected and operated the same way as in the DTV receiver apparatuses of FIGS. 14, 18 and 20. The FIG. 22 DTV receiver apparatus further includes the elements 70 and 74 that are connected and operated the same way as in the FIG. 18 DTV receiver apparatus. The decoder 27 is connected for supplying ancillary transmission pattern information to turbo decoding control circuitry 90 that controls turbo decoding in the FIG. 22 DTV receiver apparatus. The turbo decoding control circuitry 90 is connected for supplying control signals to the circuitry 91 directing the reading of anti-Gray-coded soft decisions regarding outer convolutional coding from the trace-back memory 70 of the SISO trellis decoder 29 to a nibble recoder 92. The nibble recoder 92 is conveniently constructed using ROM.

In accordance with an aspect of the invention, the nibble recoder 92 re-codes the reproduced $X_2$ and $X_1$ bits in each nibble to convert from anti-Gray code back to binary code. The re-coding is Gray coding that uses the same one of the coding tables shown in FIGS. 6 through 13 as was used FIG. 21 DTV transmitter apparatus transmitting DTV signal over the air to the FIG. 22 DTV receiver apparatus. Except for serious errors incurred in transmission and reception, the response from the nibble recoder 92 supplies soft decisions concerning reproduced response of the block-interleaved linear block coding from the interleaver 89 in the FIG. 21 DTV transmitter apparatus. The nibble recoder 92 also adjusts the respective soft-decision information in its response regarding each of the two bits in a nibble, to take into account the way in which the reproduced bit-interleaved outer coding maps against data slicing.

These soft decisions are written into a soft-input/soft-output memory 93 that is operated under control of the turbo decoding control circuitry 90 to de-interleave the soft decisions concerning block-interleaved linear block coding for application to a soft-input/soft-output decoder 94 for linear block coding. The Reed-Solomon decoder 39 is connected for receiving hard decisions concerning (207, 187) R-S FEC-coded data from the SISO decoder 94 for the LBC employed in the FIG. 21 DTV transmitter apparatus.

FIG. 22 shows the R-S decoder 39 connected for supplying the turbo decoding control circuitry 90 an indication when the decoder 39 is unable to correct any particular one of the (207, 187) R-S FEC codewords it receives from the SISO decoder 94 for LBC. If the R-S decoder 39 finds a recovered data packet to be correct or corrects the recovered data packet, the turbo decoding control circuitry 90 will discontinue further trying to correct that data packet. The turbo decoding control circuitry 90 keeps track of the number of decoding iterations for each packet in the turbo data field and the number of data packets that remain uncorrected. The turbo decoding control circuitry 90 uses this information to control the filling of subsequent buffer memory for the second transport stream. FIG. 22 does not show this subsequent buffer memory.

An "outer" soft-decision adjuster 95 is connected for adjusting the soft-decision information concerning each bit of ancillary data decoded by the SISO decoder 94 for LBC, which bit was contained within a 207-byte R-S codeword found correct or corrected by the R-S decoder 39. This adjustment reflects the altered probabilities of various possible trellis codings of the bit being correct and can expedite subsequent turbo decoding procedure. The "outer" soft-decision adjuster 95 supplies the adjusted soft-decision response of the SISO decoder 94 for LBC as input signal to a soft-input/soft-output bit interleaver 96. The bit interleaving performed by the SISO interleaver 96 is complementary to the bit de-interleaving performed when reading from the memory 93. The SISO interleaver 96 is connected to supply its response to a nibble recoder 97 as the input signal thereto.

In accordance with an aspect of the invention, the nibble recoder 97 anti-Gray codes the $X_2$ and $X_1$ bits in each nibble to convert from binary code to anti-Gray code. The re-coding uses the same one of the coding tables shown in FIGS. 6 through 13 as was used in the FIG. 21 DTV transmitter apparatus transmitting DTV signal over the air to the FIG. 22 DTV receiver apparatus. Except for errors incurred in transmission and reception, the response from the nibble recoder 97 reproduces the LBC from the encoder 88 in the FIG. 21 transmitter apparatus, but with subsequent corrections.

The response from the nibble recoder 97 is used as turbo feedback to update the contents of the traceback memory 70 before the trellis decoder 29 attempts any further decoding of a data field already decoded. Such further decoding may be attempted after the successive decoding of all the data packets in the turbo field is completed. Such further decoding is then followed by decoding the data packets in the turbo field that thus far have not been decoded successfully, so as to generate corrected data packets. Still further iterations of the decoding procedures may be attempted in line with known turbo coding procedures.

The DTV receivers of FIGS. 14, 18, 20 and 22 share a common complication in their respective operations. Because of the turbo decoding procedures being iterated varying numbers of times, it is fairly difficult to keep track of the correct de-randomization patterns to be used in the data de-randomizer 39. These difficulties are avoided by modifications of the DTV receivers of FIGS. 14, 18, 20 and 22 to perform data de-randomization before turbo decoding. Such modifications of the DTV receivers of FIGS. 14, 18, 20 and 22 require modifications of the DTV transmitters supplying them DTV signals with serially concatenated coding of the respective types that those receivers can usefully receive.

Figure 23:
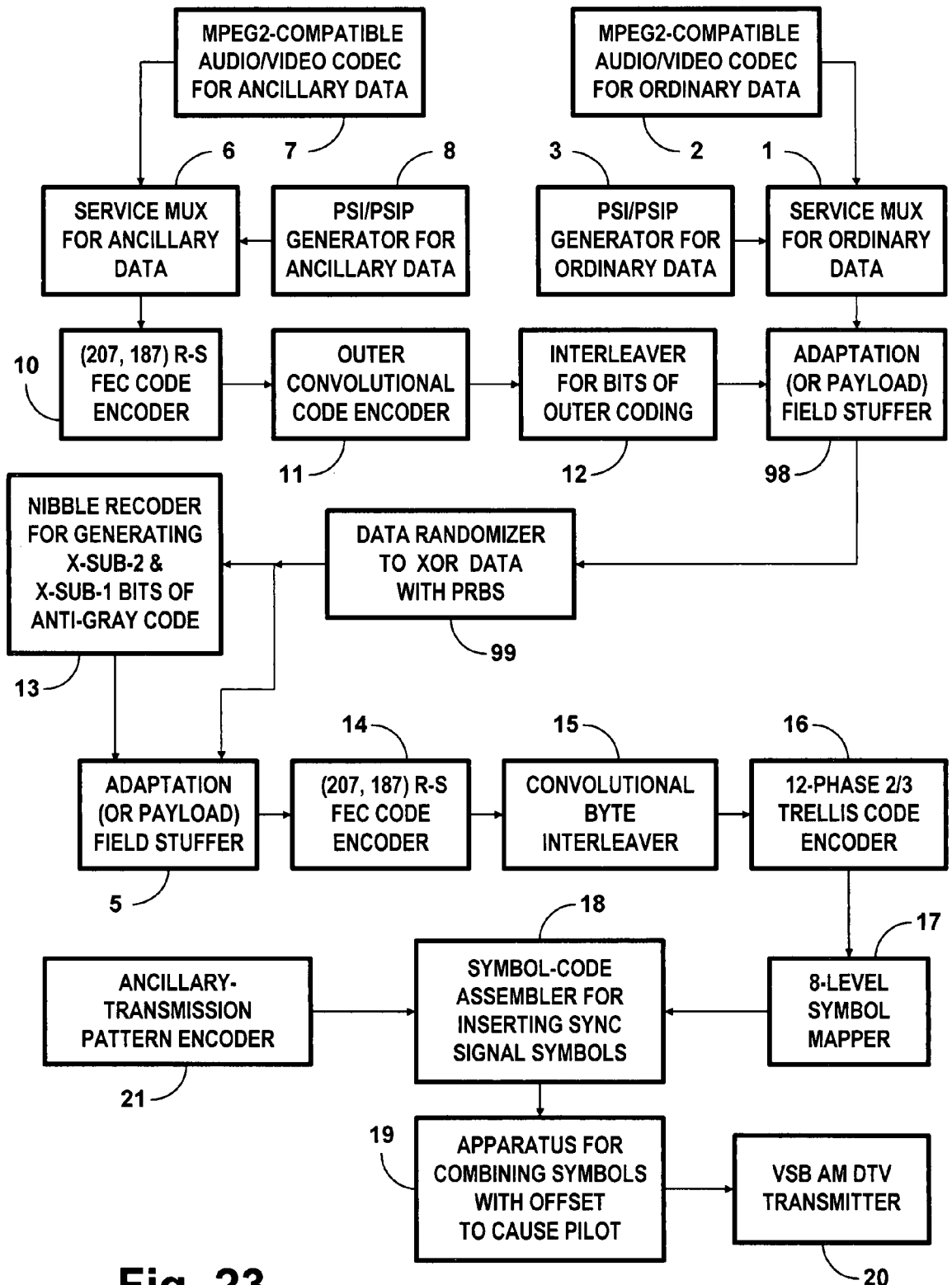
FIG. 23 is a general schematic diagram of modified FIG. 5 transmitter apparatus for broadcast digital television signals using SCCC, which modified transmitter apparatus embodies aspects of the invention.

FIG. 23 shows modified FIG. 5 DTV transmitter apparatus in which data randomization of SCCC is done differently. FIG. 23 shows the output port of the service multiplexer 6 for ancillary data connected directly to the input port of the encoder 10 for (207, 187) R-S FEC coding, and the data randomizer 9 is dispensed with. The output port of the encoder 10 is connected to the input port of the encoder 11 for outer convolutional coding, and the output port of the encoder 11 is connected to the input port of the bit interleaver 12 for outer convolutional coding. FIG. 23 shows the output port of the bit interleaver 12 connected to an input port of an adaptation field stuffer 98. FIG. 23 shows the output port of the service multiplexer 1 for ordinary data connected directly to another input port of the adaptation field stuffer 98, and the data randomizer 4 is dispensed with. The response of the adaptation field stuffer 98 reproduces the MPEG-2-compatible data packets from the service multiplexer 1 except for the adaptation fields of some of them being replaced by reproduced bit-interleaved outer convolutional coding from the bit interleaver 12. The output port of the adaptation field stuffer 98 is connected for supplying that response to a data randomizer 99 to be exclusive-ORed with portions of the PRBS prescribed in A/53, Annex D, §4.2.2. The adaptation field stuffer 5 is connected for receiving randomized MPEG-2-compatible data packets from the data randomizer 99 in place of the ones received from the data randomizer 4 in the FIG. 5 DTV transmitter apparatus. In accordance with the invention, in FIG. 23 the nibble recoder 13 is connected to anti-Gray code successive 2-bit nibbles of the randomized data from the data randomizer 99. The nibble recoder 13 is connected to supply that anti-Gray coded response to the adaptation field stuffer 5. The adaptation field stuffer 5 reproduces in its response the randomized 187-byte MPEG-2-compatible data packets from the data randomizer 99 except for replacing the placeholder bytes in the adaptation fields of selected ones of those data packets with anti-Gray coding from the nibble recoder 13. The adaptation field stuffer 5 is replaced by a payload field stuffer 5 in a variant of the FIG. 23 transmitter apparatus.

Figure 24:
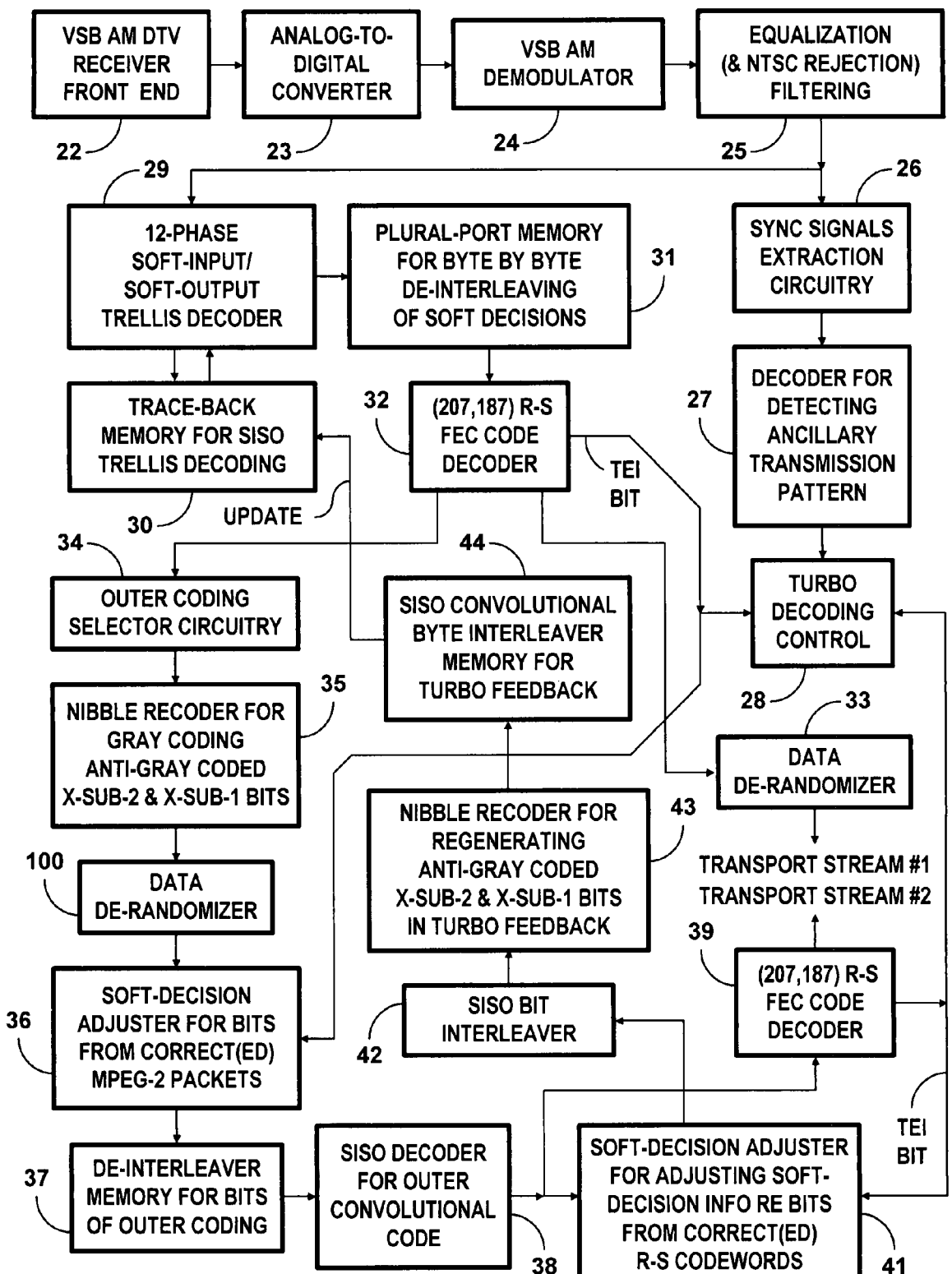
FIG. 24 is a general schematic diagram of modified FIG. 14 receiver apparatus for broadcast digital television signals transmitted by transmitter apparatus of the sort shown in FIG. 23, which receiver apparatus embodies aspects of the invention and uses turbo decoding procedures.

FIG. 24 shows modified FIG. 14 receiver apparatus for broadcast digital television signals transmitted by transmitter apparatus of the sort shown in FIG. 23. The FIG. 24 receiver apparatus differs from the FIG. 14 receiver apparatus in that a data de-randomizer 100 is in cascade connection with the soft-decision adjuster 36 between the nibble recoder 35 and the de-interleaver memory 37. Alternatively, the soft-decision adjuster 36 can precede the data de-randomizer 100 in their cascade connection, rather than succeeding it as shown in FIG. 24. The FIG. 24 receiver apparatus differs from the FIG. 14 receiver apparatus also in that the data de-randomizer 40 is dispensed with and the second transport stream is supplied directly from the R-S decoder 39.

Figure 25:
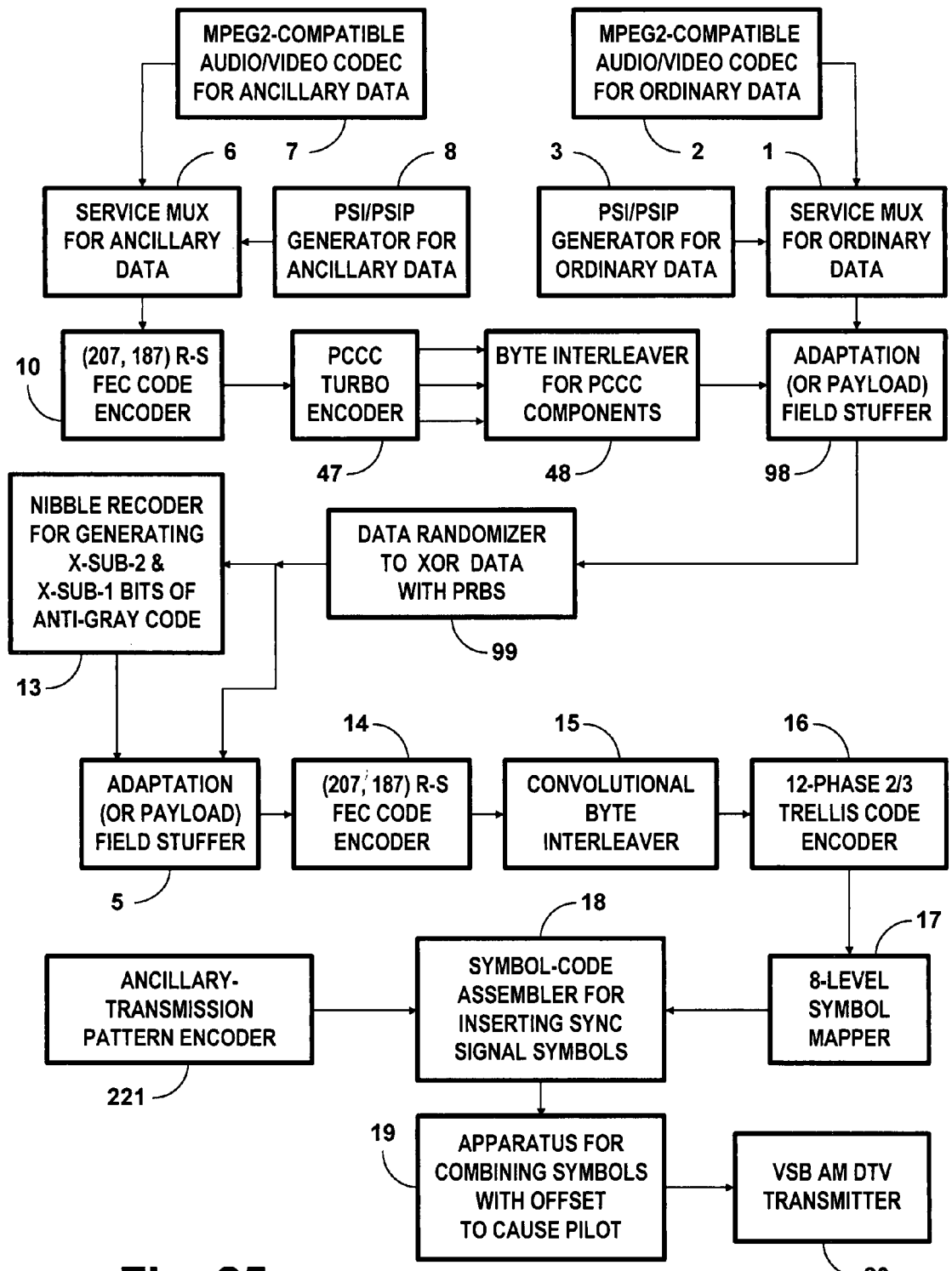
FIG. 25 is a general schematic diagram of modified FIG. 19 transmitter apparatus for broadcast digital television signals using PCCC, which transmitter apparatus embodies aspects of the invention.

FIG. 25 shows modified FIG. 19 DTV transmitter apparatus in which data randomization of PCCC is done differently. FIG. 25 shows the output port of the service multiplexer 6 for ancillary data connected directly to the input port of the R-S encoder 10, and the data randomizer 9 is dispensed with. The output port of the R-S encoder 10 is connected to the input port of the PCCC turbo encoder 47, and the output port of the encoder 47 is connected to the input port of the byte interleaver 48 for PCCC component signals. FIG. 25 shows the output port of the byte interleaver 48 connected to an input port of the adaptation field stuffer 98. FIG. 25 shows the output port of the service multiplexer 1 for ordinary data connected directly to the other input port of the adaptation field stuffer 98, and the data randomizer 4 is dispensed with. The response of the adaptation field stuffer 98 reproduces the MPEG-2-compatible data packets from the service multiplexer 1 except for the adaptation fields of some of them being replaced by reproduced PCC coding from the byte interleaver 48. The output port of the adaptation field stuffer 98 is connected for supplying that response to the data randomizer 99. In accordance with the invention, in FIG. 23 the nibble recoder 13 is connected to anti-Gray code successive 2-bit nibbles of the randomized MPEG-2-compatible data packets from the data randomizer 99. The nibble recoder 13 is connected to supply that anti-Gray coded response to the adaptation field stuffer 5. The adaptation field stuffer 5 reproduces in its response the randomized 187-byte MPEG-2-compatible data packets from the data randomizer 99, except for replacing the placeholder bytes in the adaptation fields of selected ones of those data packets with anti-Gray coding from the nibble recoder 13. The adaptation field stuffer 5 is replaced by a payload field stuffer 5 in a variant of the FIG. 23 transmitter apparatus.

Figure 26:
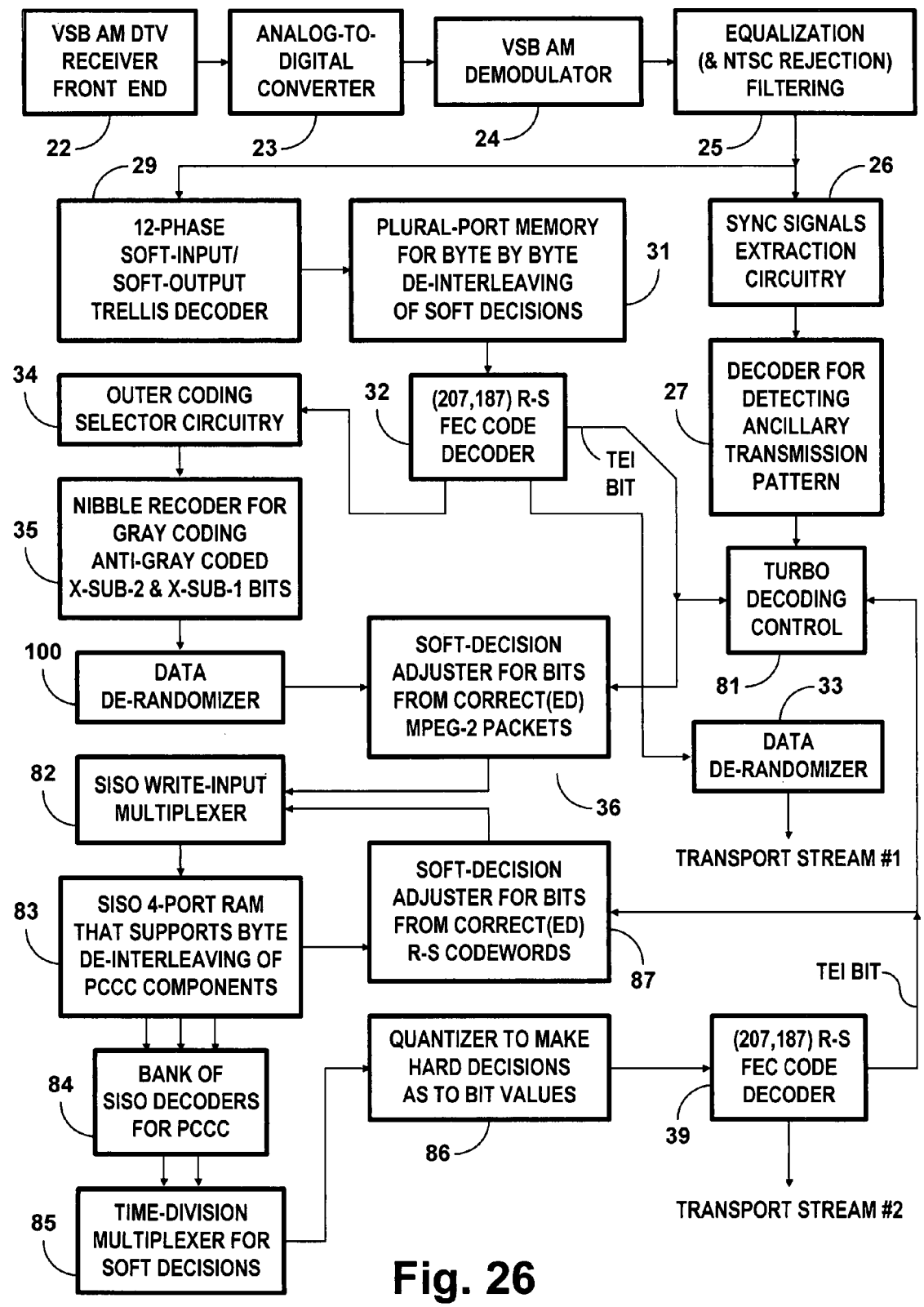
FIG. 26 is a general schematic diagram of modified FIG. 20 receiver apparatus for broadcast digital television signals transmitted by transmitter apparatus of the sort shown in FIG. 25, which receiver apparatus embodies aspects of the invention and uses turbo decoding procedures.

FIG. 26 shows modified FIG. 20 receiver apparatus for broadcast digital television signals transmitted by transmitter apparatus of the sort shown in FIG. 25. The FIG. 26 receiver apparatus differs from the FIG. 20 receiver apparatus in that a data de-randomizer 100 is in cascade connection with the soft-decision adjuster 36 between the nibble recoder 35 and the write-input multiplexer 82. Alternatively, the soft-decision adjuster 36 can precede the data de-randomizer 100 in their cascade connection, rather than succeeding it as shown in FIG. 26. The FIG. 26 receiver apparatus differs from the FIG. 20 receiver apparatus also in that the data de-randomizer 40 is dispensed with and the second transport stream is supplied directly from the R-S decoder 39.

Figure 27:
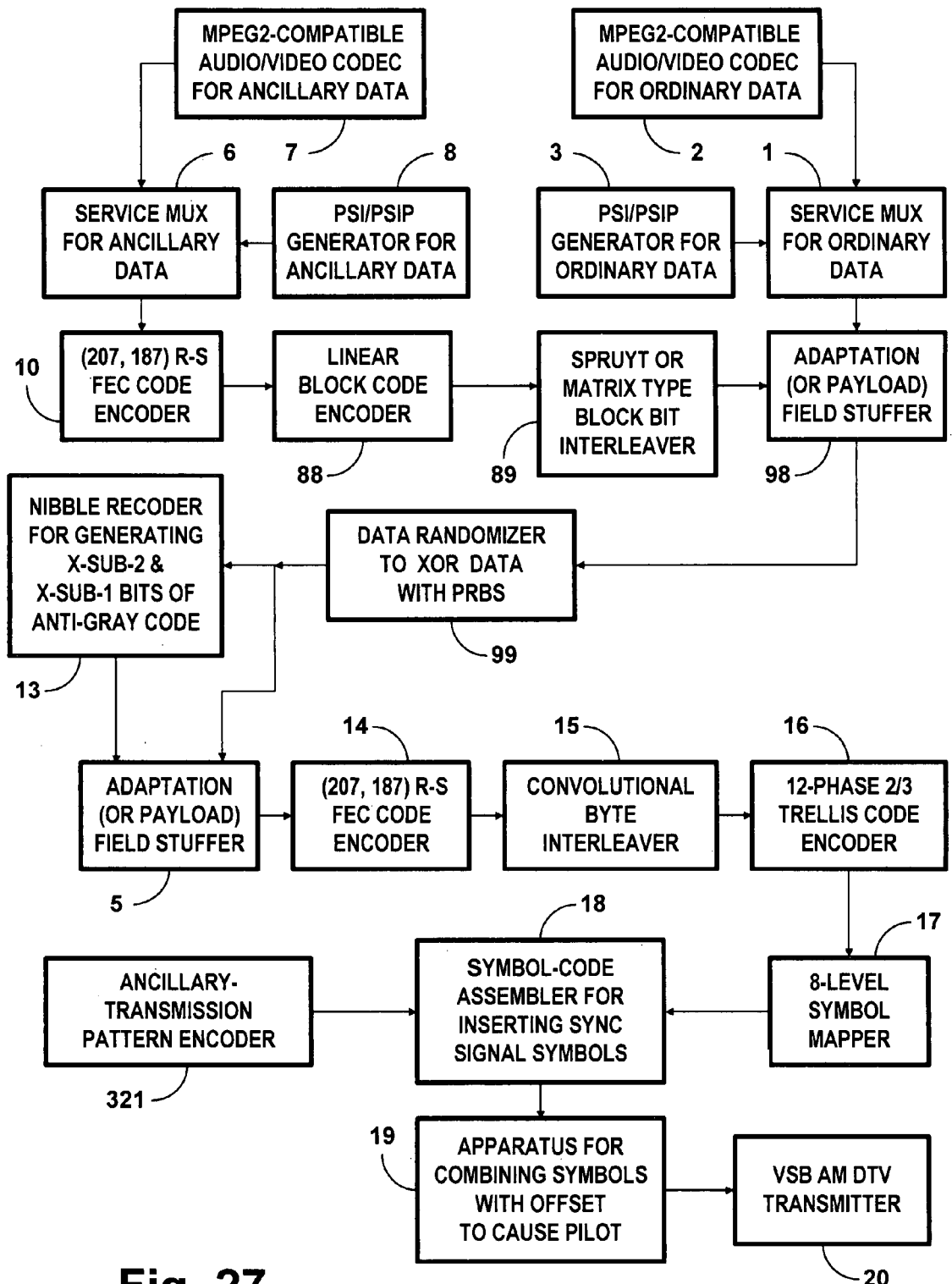
FIG. 27 is a general schematic diagram of modified FIG. 21 transmitter apparatus for broadcast digital television signals using SCC that follows LBC with convolutional ⅔ trellis coding, which transmitter apparatus embodies aspects of the invention.

FIG. 27 shows modified FIG. 21 DTV transmitter apparatus in which data randomization is done differently in broadcast digital television signals using SCC that follows LBC with convolutional ⅔ trellis coding. FIG. 27 shows the output port of the service multiplexer 6 for ancillary data connected directly to the input port of the R-S encoder 10, and the data randomizer 9 is dispensed with. The output port of the R-S encoder 10 is connected to the input port of the LBC encoder 88, and the output port of the encoder 88 is connected to the input port of the block interleaver 89 for LBC bits. FIG. 27 shows the output port of the bit interleaver 89 connected to an input port of the adaptation field stuffer 98. FIG. 27 shows the output port of the service multiplexer 1 for ordinary data connected directly to the other input port of the adaptation field stuffer 98, and the data randomizer 4 is dispensed with. The response of the adaptation field stuffer 98 reproduces the MPEG-2-compatible data packets from the service multiplexer 1 except for the adaptation fields of some of them being replaced by reproduced LBC coding from the bit interleaver 89. The output port of the adaptation field stuffer 98 is connected for supplying that response to the data randomizer 99. In accordance with the invention, in FIG. 27 the nibble recoder 13 is connected to anti-Gray code successive 2-bit nibbles of the randomized MPEG-2-compatible data packets from the data randomizer 99. The nibble recoder 13 is connected to supply that anti-Gray coded response to the adaptation field stuffer 5. The adaptation field stuffer 5 reproduces in its response the randomized 187-byte MPEG-2-compatible data packets from the data randomizer 99 except for replacing the placeholder bytes in the adaptation fields of selected ones of those data packets with anti-Gray coding from the nibble recoder 13. The adaptation field stuffer 5 is replaced by a payload field stuffer 5 in a variant of the FIG. 27 transmitter apparatus.

Figure 28:
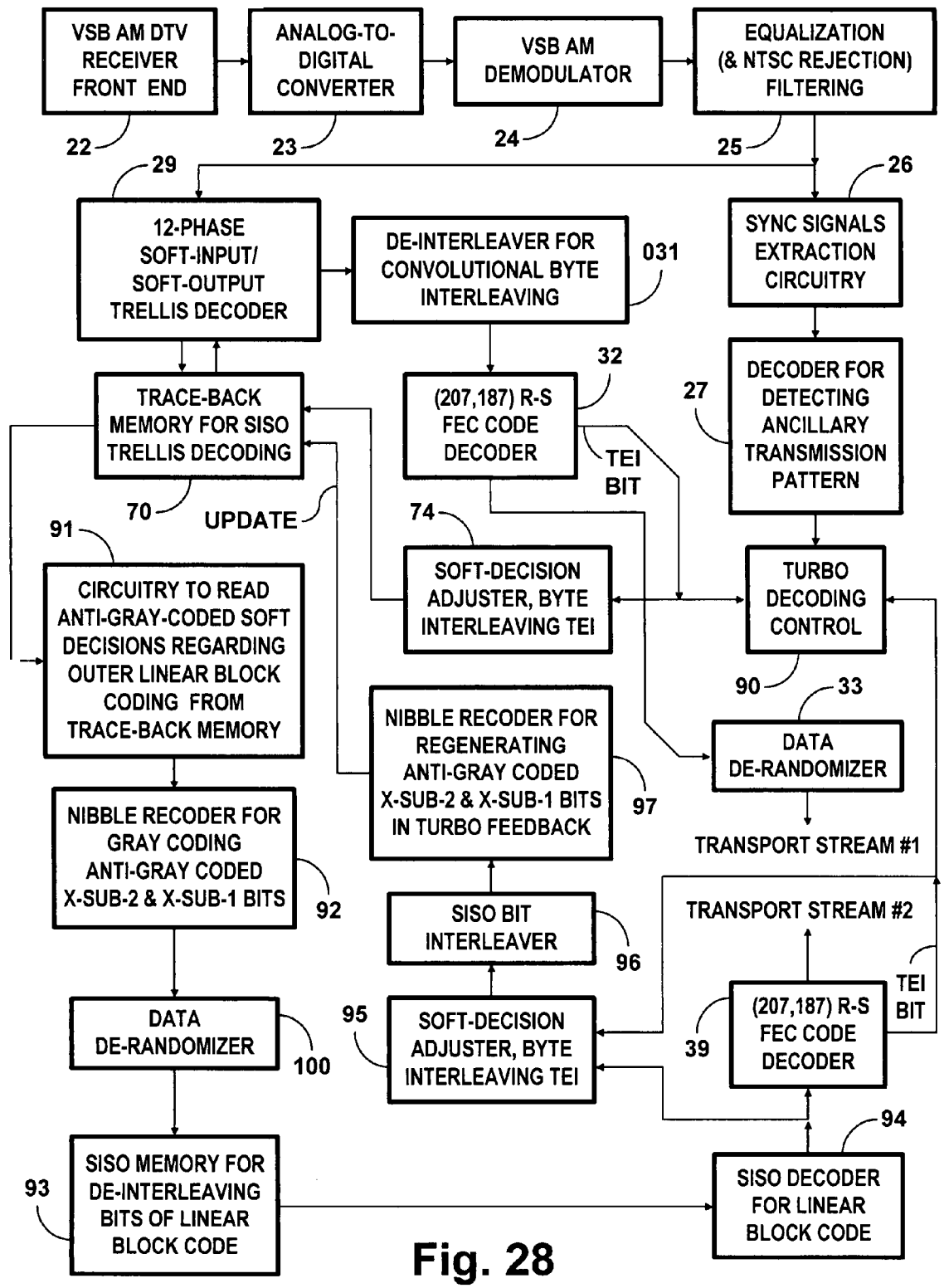
FIG. 28 is a general schematic diagram of receiver apparatus for broadcast digital television signals transmitted by transmitter apparatus of the sort shown in FIG. 27, which receiver apparatus embodies aspects of the invention.

FIG. 28 shows receiver apparatus for broadcast digital television signals transmitted by transmitter apparatus of the sort shown in FIG. 27. The FIG. 28 receiver apparatus differs from the FIG. 22 receiver apparatus in that a data de-randomizer 100 is interposed between the nibble recoder 92 and the SISO memory 93 for de-interleaving LBC bits. The FIG. 28 receiver apparatus differs from the FIG. 22 receiver apparatus also in that the data de-randomizer 40 is dispensed with and the second transport stream is supplied directly from the R-S decoder 39.

Figure 29:
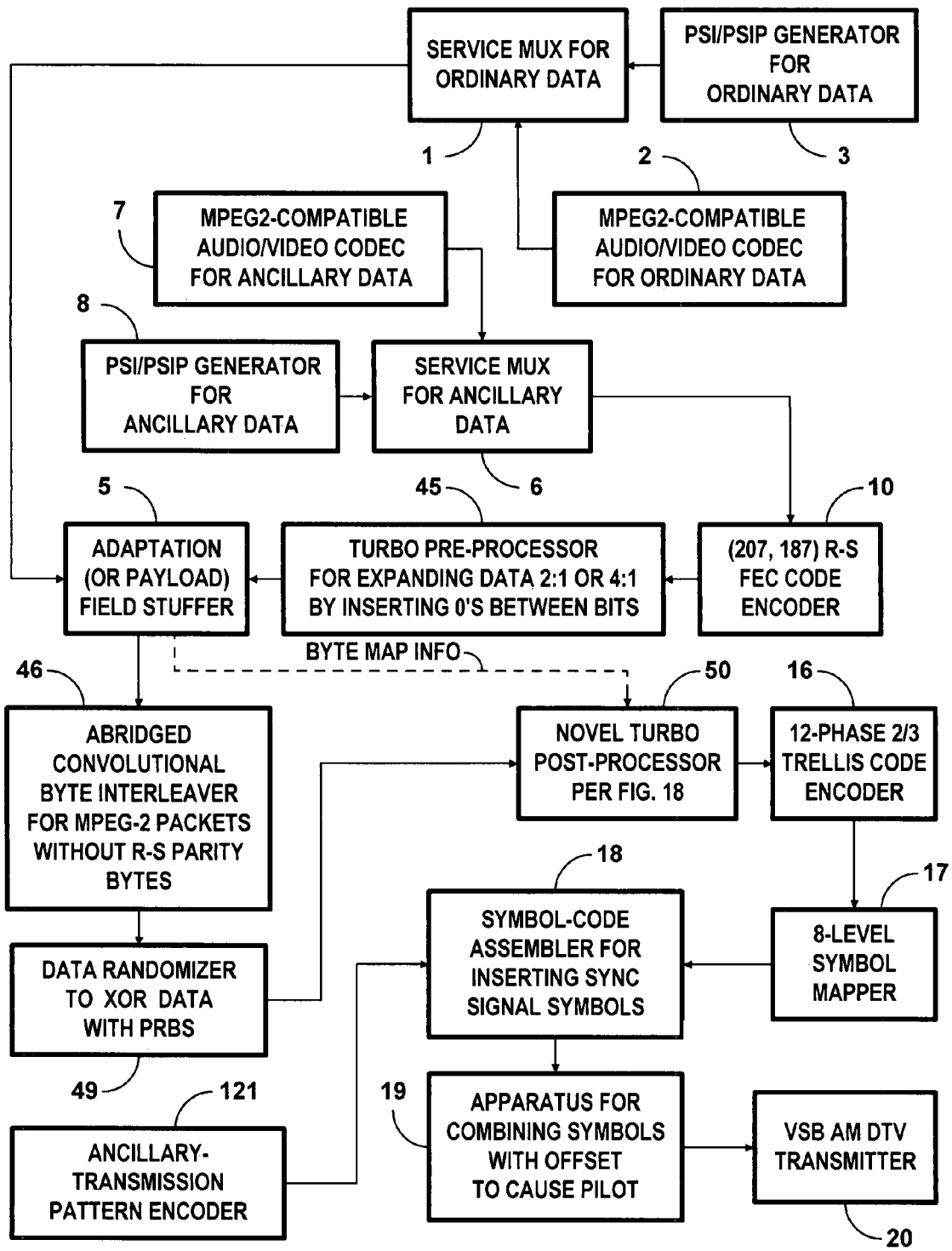
FIG. 29 is a general schematic diagram of modified FIG. 17 transmitter apparatus for broadcast digital television signals using SCCC of AVSB type or the like, which modified transmitter apparatus embodies aspects of the invention.

FIG. 29 shows modified FIG. 17 transmitter apparatus in which data randomization is done differently in broadcast digital television signals using SCCC of AVSB type or the like. FIG. 29 shows the output port of the service multiplexer 1 for ordinary data connected directly to an input port of the adaptation field stuffer 98, and the data randomizer 4 is dispensed with. FIG. 29 shows the output port of the service multiplexer 6 for ancillary data connected directly to the input port of the R-S encoder 10, and the data randomizer 9 is dispensed with. The output port of the abridged convolutional byte interleaver 46 does not connect directly to the input port of the turbo post-processor 50 in the FIG. 29 DTV transmitter apparatus, but rather to the input port of a data randomizer 49. The data randomizer 49 generates its response, which is applied to the input port of the turbo post-processor 50, by exclusive-ORing the response of the byte interleaver 46 with portions of the PRBS prescribed in A/53, Annex D, §4.2.2.

Figure 30:
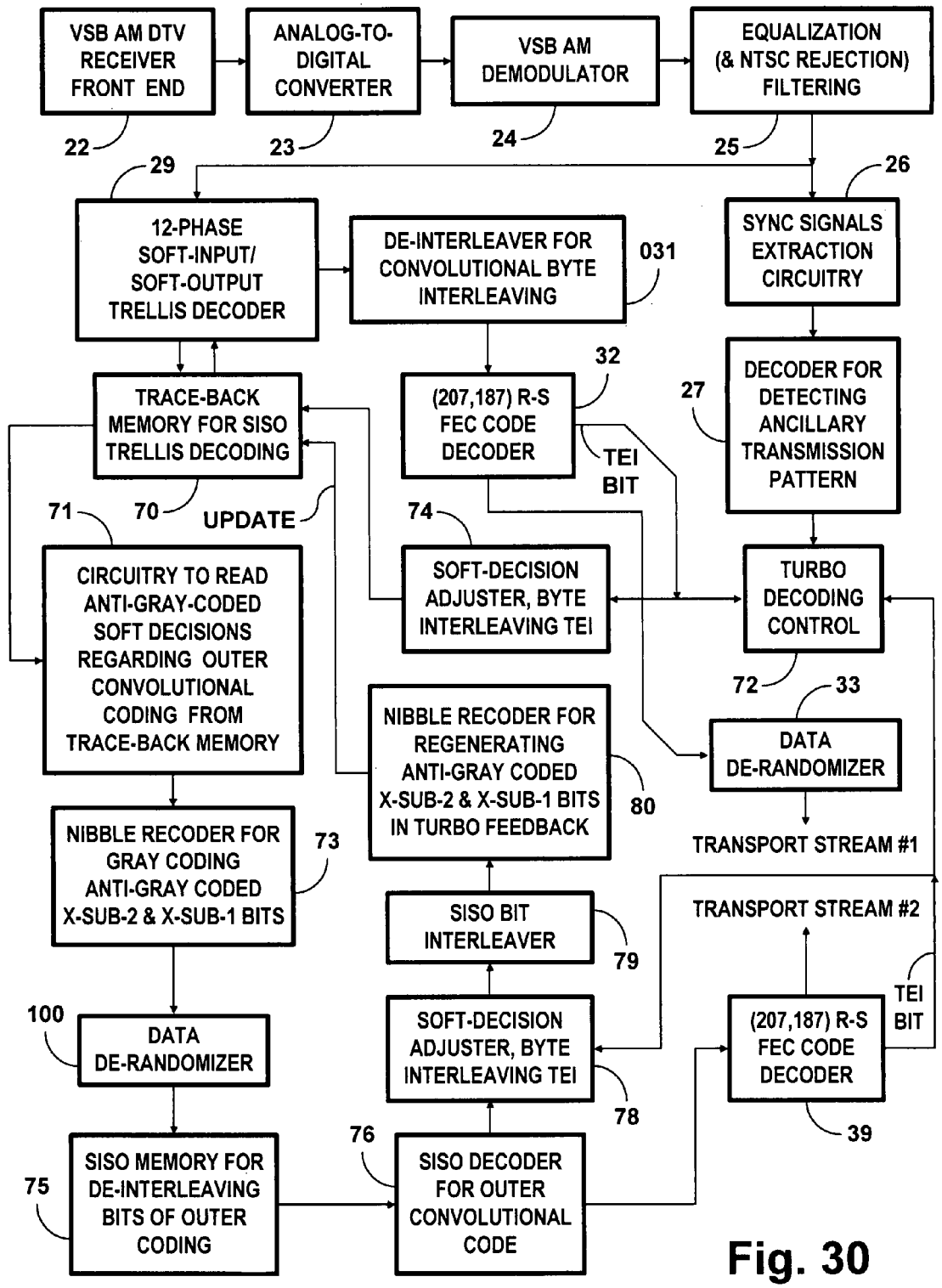
FIG. 30 is a general schematic diagram of modified FIG. 18 receiver apparatus for broadcast digital television signals transmitted by transmitter apparatus of the sort shown in FIG. 29, which receiver apparatus embodies aspects of the invention and uses turbo decoding procedures.

FIG. 30 shows modified FIG. 18 receiver apparatus for broadcast digital television signals transmitted by transmitter apparatus of the sort shown in FIG. 29. The FIG. 30 receiver apparatus differs from the FIG. 18 receiver apparatus in that a data de-randomizer 100 is interposed between the nibble recoder 73 and the SISO memory 75 for de-interleaving bits of the outer convolutional coding. The FIG. 30 receiver apparatus differs from the FIG. 18 receiver apparatus also in that the data de-randomizer 40 is dispensed with and the second transport stream is supplied directly from the R-S decoder 39.

Figure 31:
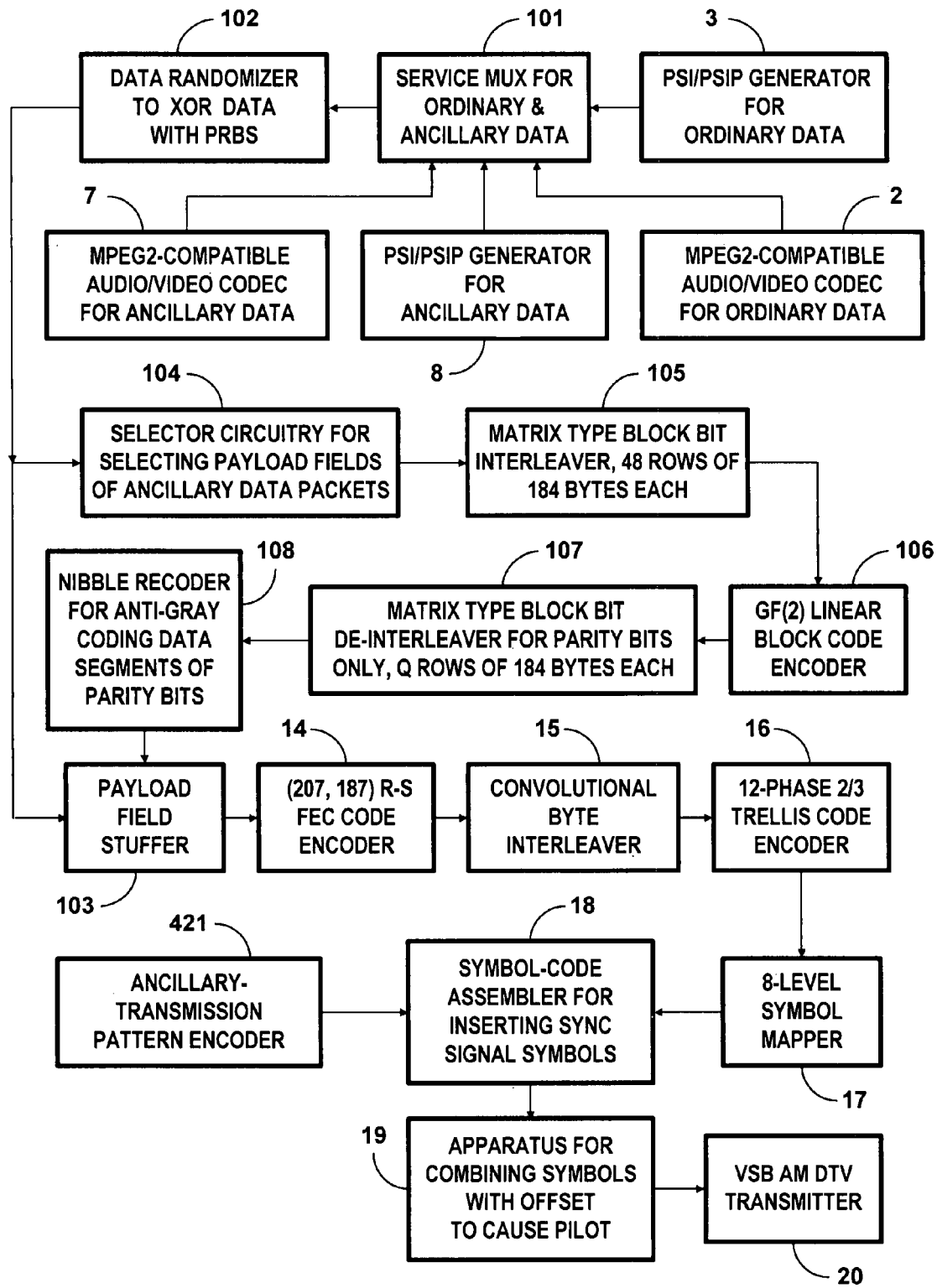
FIG. 31 is a general schematic diagram of transmitter apparatus for broadcast digital television signals using SCC in which LBC that is transversal to data segments is followed by convolutional ⅔ trellis coding, which transmitter apparatus embodies aspects of the invention.

FIG. 31 shows transmitter apparatus for broadcast digital television signals using SCC in which LBC that is transversal to data segments is followed by convolutional ⅔ trellis coding. Anti-Gray coding of transversal linear block coding prior to ⅔ trellis coding is particularly advantageous for GF(2) LBCs. The parity bytes generated by transversal LBC coding can be placed into MPEG-2-compatible data packets with the PID used for null packets. Alternatively, the parity bytes generated by transversal LBC coding can be placed into MPEG-2-compatible data packets with an especial PID indicative of their content. Anti-Gray coding of transversal linear block coding prior to ⅔ trellis coding is not particularly advantageous for GF($2^p$) LBCs in which the integer p power is more than one. In these codes each code symbol consists of a group of p bits. A double-bit error in a single symbol of such codes is less disruptive than two single-bit errors in separate symbols. No matter whether there is a single-bit error or a double-bit error in a plural-bit symbol, the symbol as a whole will be in error. LBCs that use symbols chosen from a GF(256) Galois field include (255, 255-2t) Reed-Solomon forward-error-correction codes and shortened forms of such codes in which certain of the bytes of codewords have prescribed values that are omitted from those codewords as transmitted. The use of such codes for coding along paths transversal to segments of a data field is described in U.S. Pat. No. 7,197,685 granted 27 Mar. 2007 to A. L. R. Limberg and titled "Robust signal transmissions in digital television broadcasting". Anti-Gray coding of transversal linear block coding prior to ⅔ trellis coding is not particularly advantageous for these GF(256) LBCs, by way of example.

FIG. 31 shows DTV transmitter apparatus which the parity bytes for LBC that is transversal to data segments are stuffed into the payload fields of MPEG-2-compatible packets that legacy DTV receivers will disregard. The FIG. 31 DTV transmitter apparatus employs a service multiplexer 101 both for ordinary data and ancillary data instead of the service multiplexer 1 for ordinary data and the service multiplexer 4 for ancillary data. The service multiplexer 101 is connected for time-division multiplexing 187-byte MPEG-2-compatible data packets from the audio/video codecs 2 and 7 and from the PSIP/PSI generators 3 and 8. The service multiplexer 101 is further connected for applying the time-division multiplexed MPEG-2-compatible data packets to a data randomizer 102 to be exclusive-ORed with portions of a pseudo-random binary sequence (PRBS) prescribed in A/53, Annex D, §4.2.2 titled "Data randomizer". The data randomizer 102 is connected for supplying the resulting randomized 187-byte MPEG-2-compatible data packets to a payload field stuffer 103 that stuffs transversal LBC parity bytes into the payload fields of certain of those packets.

The data randomizer 102 is connected for also supplying the randomized 187-byte MPEG-2-compatible data packets to selector circuitry 104 that selects just the payload fields of packets of ancillary data for application to the input port of a matrix type block bit interleaver 105. The block bit interleaver 105, an encoder 106 for GF(2) linear block code, and a matrix type block bit de-interleaver 107 cooperate to provide transversal coding of the payload fields of a number P of successive 187-byte randomized MPEG-2-compatible packets of ancillary data from the data randomizer 9. P is conveniently made 48.

The block bit interleaver 105 comprises two banks of memory that are alternated with each other being written to and being read from. Each bank of memory in the interleaver 105 is composed of 48 rows of bit-storage locations, 1472 bit-storage locations per row. The payload fields of 48 successive 187-byte randomized MPEG-2-compatible packets of ancillary data supplied from the selector circuitry 104 are written into respective rows of 1472 bit-storage locations in one bank of memory. This is done while 1472 columns of bit-storage locations in the other bank of memory are successively read to generate 48-bit slivers of transversely scanned randomized ancillary data, which are then supplied serially from the output port of the block bit interleaver 105.

The input port of the encoder 106 for GF(2) linear block code is connected for receiving, as its input signal, the 1472 forty-eight-bit slivers of transversely scanned randomized ancillary data from the output port of the block bit interleaver 105. In one embodiment of the FIG. 31 DTV transmitter apparatus the encoder 106 is a (24, 12) binary Golay encoder, and each 48-bit sliver of input signal supplied to the encoder 106 generates 48 parity bits. This a little more than halves code rate for ancillary data as compared to ordinary 8VSB data, the little more than halving of code rate being attributable to the losses associated with segment headers and with the R-S FEC code parity bytes. In another embodiment of the FIG. 31 DTV transmitter apparatus the encoder 106 is a (23, 12) binary Golay encoder, and each 48-bit sliver of input signal supplied to the encoder 106 generates 44 parity bits. This does not quite halve code rate for ancillary data as compared to ordinary 8VSB data. In still another embodiment of the FIG. 31 DTV transmitter apparatus the encoder 106 uses a (15, 8) Hamming code, and each 48-bit sliver of input signal supplied to the encoder 106 generates 42 parity bits. This also does not quite halve code rate for ancillary data as compared to ordinary 8VSB data.

The block bit de-interleaver 107 comprises two banks of memory that are alternated with each other being written to and being read from. Each bank of memory in the de-interleaver 107 can store the parity bits that the LBC encoder 106 generates from the payload fields of 48 successive 187-byte randomized MPEG-2-compatible packets of ancillary data. The output port of the LBC encoder 106 is connected for supplying the parity bits generated from each 48-bit sliver to the input port of the matrix type block bit de-interleaver 107. Those parity bits are written into a respective column of storage locations in one of the banks of memory in the block bit de-interleaver 107. This is done while the rows of storage locations in the other bank of memory are successively read to generate laterally scanned transversely coded randomized ancillary data, which are then supplied from the output port of the block bit de-interleaver 107.

In accordance with an aspect of the invention, a nibble recoder 108 anti-Gray codes successive 2-bit nibbles of the output signal from the block bit de-interleaver 107 to generate its response. The nibble recoder 108 is connected to supply that anti-Gray coded response to the payload field stuffer 103. The payload field stuffer 103 reproduces in its response the randomized 187-byte MPEG-2-compatible data packets from the data randomizer 102 except for replacing the placeholder bytes in the payload fields of selected ones of those data packets with anti-Gray coding from the nibble recoder 108.

The payload field stuffer 103 is connected for supplying its response comprising 187-byte packets to the encoder 14 that generates a respective (207, 187) R-S FEC codeword in response to each of these packets. The R-S encoder 14 is connected for supplying its 207-byte codewords to the convolutional byte interleaver 15. The convolutional byte interleaver 15 is connected to supply the convolutionally interleaved bytes of the (207, 187) R-S FEC codewords to the 12-phase encoder 16 for ⅔ trellis code. The encoder 16 supplies groups of three bits to an 8-level symbol mapper 17 that responds to supply 8-level symbols to a symbol code assembler 18. The symbol code assembler 18 inserts data segment synchronization (DSS) symbols and data field synchronization (DFS) symbols into the symbol stream before it is supplied to apparatus 19 that combines the symbols with an offset to supply digital modulating signal to the VSB AM transmitter 20 for DTV signal. Subsequent to the payload field stuffer 103, the only difference from the transmitter practice prescribed by A/53 Annex D is the following. The reserved section of the DFS signal at the beginning of each data field contains a code sequence specifying the pattern of the ancillary (transversal LBC) transmission in at least that field. FIG. 31 shows an encoder 421 connected for supplying these code sequences to the symbol code assembler 18.

Figure 32:
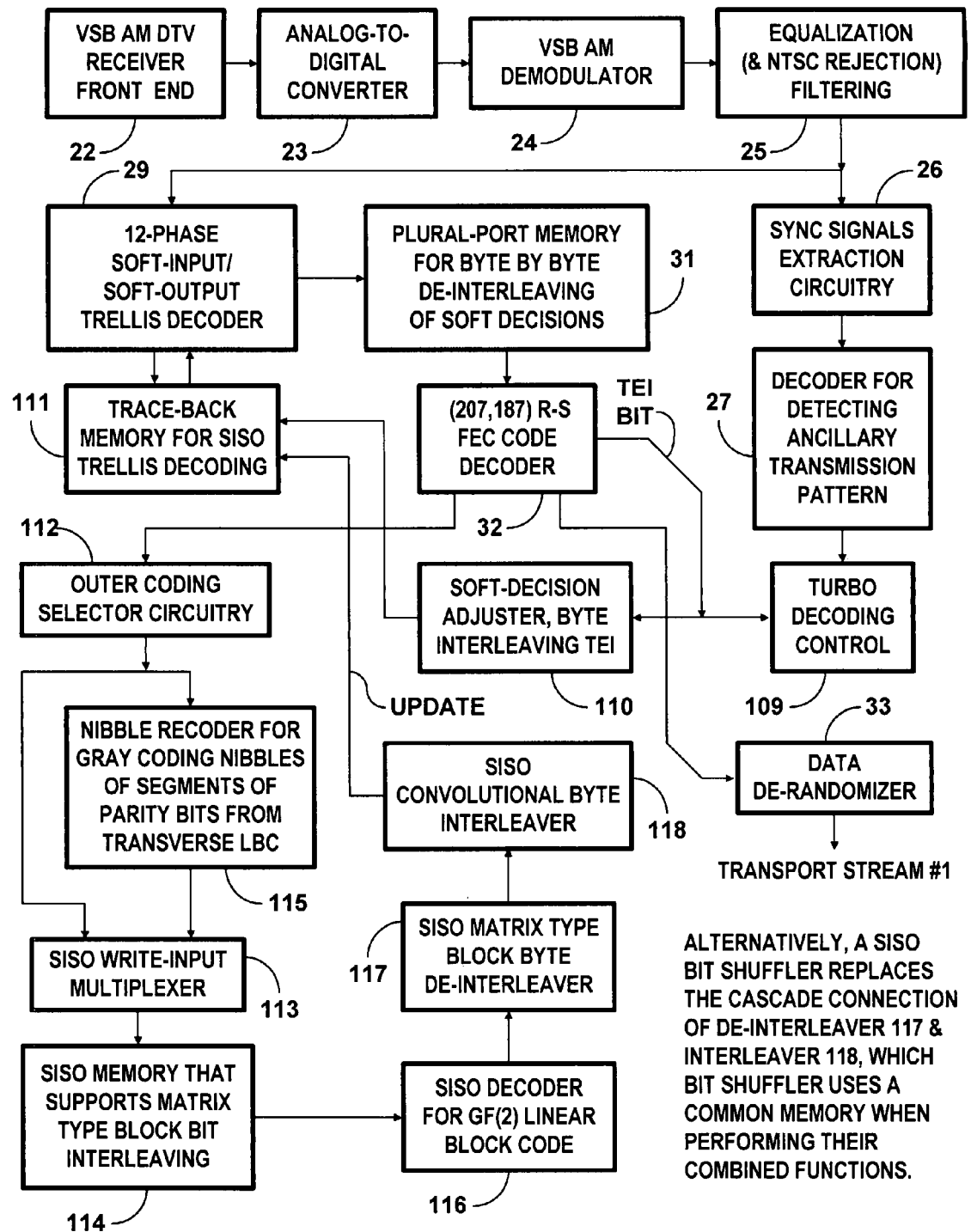
FIG. 32 is a general schematic diagram of receiver apparatus for broadcast digital television signals transmitted by transmitter apparatus of the sort shown in FIG. 31, which receiver apparatus embodies aspects of the invention and uses turbo decoding procedures.

FIG. 32 shows receiver apparatus for broadcast digital television signals transmitted by transmitter apparatus of the sort shown in FIG. 31, which receiver apparatus uses turbo decoding procedures. The FIG. 32 DTV receiver apparatus includes the elements 22, 23, 24, 25, 26, 27, 29, 31, 32, 33 and 34, which are connected and operated the same way as in the FIG. 14 DTV receiver apparatus, except as particularly noted hereafter. The decoder 27 is connected for supplying ancillary transmission pattern information to turbo decoding control circuitry 109 that controls turbo decoding in the FIG. 32 DTV receiver apparatus.

FIG. 32 shows the R-S decoder 32 connected for supplying soft decisions concerning 187-byte data packets that have been corrected insofar as possible to an "inner" soft-decision adjuster 110. The trace-back memory 30 of the 12-phase SISO trellis decoder 29 of the FIG. 14 DTV receiver apparatus is replaced in the FIG. 32 DTV receiver apparatus by trace-back memory 111. The trace-back memory 111 can be updated from the soft-decision adjuster 110 besides being updated by extrinsic information associated with turbo decoding. The "inner" soft-decision adjuster 110 is connected for adjusting the soft decision of bits stored in the trace-back memory 111, if the R-S decoder 32 found the 187-byte data packet the bits are from to have been correct, or was able to correct that R-S packet. This adjustment reflects the changed probabilities of various possible trellis codings of the bit being correct and can expedite subsequent turbo decoding procedure. FIG. 32 shows the R-S decoder 32 also connected for supplying soft decisions concerning 187-byte data packets that have been corrected insofar as possible to outer coding selector circuitry 112. The outer coding selector circuitry 112 selects transversal LBC from the payload fields of those 187-byte data packets containing either ancillary data or parity bits for transversal LBC.

FIG. 32 shows the output port of the outer coding selector circuitry 112 connected for supplying transversal LBC to a first of two input ports of a soft-input/soft-output write-input multiplexer 113 for soft-input/soft-output memory 114. FIG. 32 shows the output port of the outer coding selector circuitry 112 connected also to the input port of a nibble recoder 115. In accordance with an aspect of the invention, the nibble recoder 115 re-codes the reproduced $X_2$ and $X_1$ bits in each nibble of the response of the outer coding selector circuitry 112. The output port of the nibble recoder 115 is connected for supplying its response to a second of the two input ports of the SISO write-input multiplexer 113 for the SISO memory 114. The nibble recoder 115 uses the same one of the coding tables shown in FIGS. 6 through 13 for Gray coding nibbles as was used by the nibble recoder 108 for anti-Gray coding in the FIG. 31 apparatus transmitting DTV signal to the FIG. 32 DTV receiver apparatus. The nibble recoder 115 also adjusts the respective soft-decision information in its response regarding each of the two bits in each successive nibble, to take into account the way in which the reproduced bit-interleaved outer coding maps against data slicing.

The purpose of the nibble recoder 115 is to convert all anti-Gray coded bytes of transversal LBC back to binary numerical code. The write-input multiplexer 113 selectively reproduces at its output port only these bytes of the nibble recoder 115 response supplied to its second input port. The write-input multiplexer 113 also selectively reproduces at its output port the bytes of transversal LBC packets that were not anti-Gray coded in the FIG. 31 DTV transmitter apparatus—namely, the payload bytes of the original MPEG-2-compatible packets supplied for transversal linear block coding. These bytes are reproduced responsive to bytes supplied to the first input port of the write-input multiplexer 113. The operations of the write-input multiplexer 113 and the memory 114 are controlled by control signals supplied them from the turbo decoding control circuitry 109 via connections not explicitly shown in FIG. 32.

The SISO memory 114 supports matrix type block bit interleaving to recover transversal LBCs for application to a soft-input/soft-output decoder 116 for GF(2) LBC. FIG. 32 shows an output port of the SISO decoder 116 connected for supplying soft decisions to an input port of a soft-input/soft-output matrix type block bit de-interleaver 117 as input signal thereto. FIG. 32 further shows an output port of the bit de-interleaver 117 connected for supplying soft decisions to an input port of a soft-input/soft-output convolutional byte interleaver 118 as input signal thereto. FIG. 32 further shows an output port of the convolutional byte interleaver 118 connected for supplying soft decisions to an input port of the trace-back memory 111 of the 12-phase SISO trellis decoder 29 for completing the turbo feedback connection to that decoder 29. The matrix type block bit de-interleaver 117 converts the transversal scanning of soft decisions concerning the systematic data bytes to lateral scanning of those soft decisions as related to corrected payloads of de-interleaved randomized MPEG-2-compatible data packets. The convolutional byte interleaver 118 interleaves these de-interleaved randomized MPEG-2-compatible data packets in accordance with the pattern prescribed in A/53, Annex D, §4.2.4. This places the soft decisions into interleaved data fields that can be matched up with soft decisions in the trace-back memory 111 when generating extrinsic information for updating the soft decisions in the trace-back memory 111 in accordance with turbo decoding procedures.

The operations of the SISO decoder 116 for GF(2) LBC, the cascaded matrix type block bit de-interleaver 117 and the convolutional byte interleaver 118 are controlled by control signals supplied them from the turbo decoding control circuitry 109 via connections not explicitly shown in FIG. 32. The addressing of the memories respectively used in the matrix type block bit de-interleaver 117 and the convolutional byte interleaver 118 will take into account that the soft decisions that the SISO decoder 116 generates concerning the systematic data bytes are interspersed by many other bytes. These other bytes are of no consequence to generating extrinsic information for updating the soft decisions in the trace-back memory 111, and the memories respectively used in the de-interleaver 117 and the interleaver 118 preferably omit actual temporary storage locations for these other bytes. In practice, the cascade connection of the de-interleaver 117 and the interleaver 118 shown in FIG. 32 is apt to be replaced by a soft-input/soft-output decoder bit shuffler that uses common memory for performing the combined functions of the replaced elements.

In the turbo decoding done in the FIG. 32 DTV receiver apparatus, the ultimate decoding of MPEG-2-compatible data packets having transversal linear block coding is performed by the 12-phase SISO trellis decoder 29. Turbo decoding of portions of data fields containing interleaved (207, 187) R-S FEC codewords, the payload portions of which are transversely linear block coded, is discontinued if the R-S decoder 32 finds all of those (207, 187) R-S FEC codewords to be correct or to have been corrected. The turbo decoding control circuitry 109 keeps track of the TEIs that are supplied to it by the R-S decoder 32 for this purpose. If the turbo decoding procedures tend to reiterate too many times, the turbo decoding control circuitry 109 will curtail them.

The DTV broadcast system using transverse LBC as described with reference to FIGS. 31 and 32 is readily modified to use adaptation field stuffing techniques similar to those in DTV broadcast systems described earlier in this document. Adaptation field stuffing or payload field stuffing techniques can be modified such that the headers of the 187-byte MPEG-2-compatible data packets are transversally linear block coded in addition to their payload fields. The use of adaptation field stuffing or payload field stuffing can also be modified to permit the 187-byte MPEG-2-compatible data packets being R-S FEC coded before being transversally linear block coded and the parity bytes of the resulting R-S FEC codewords being included in the transversal linear block coding.

Figure 33:
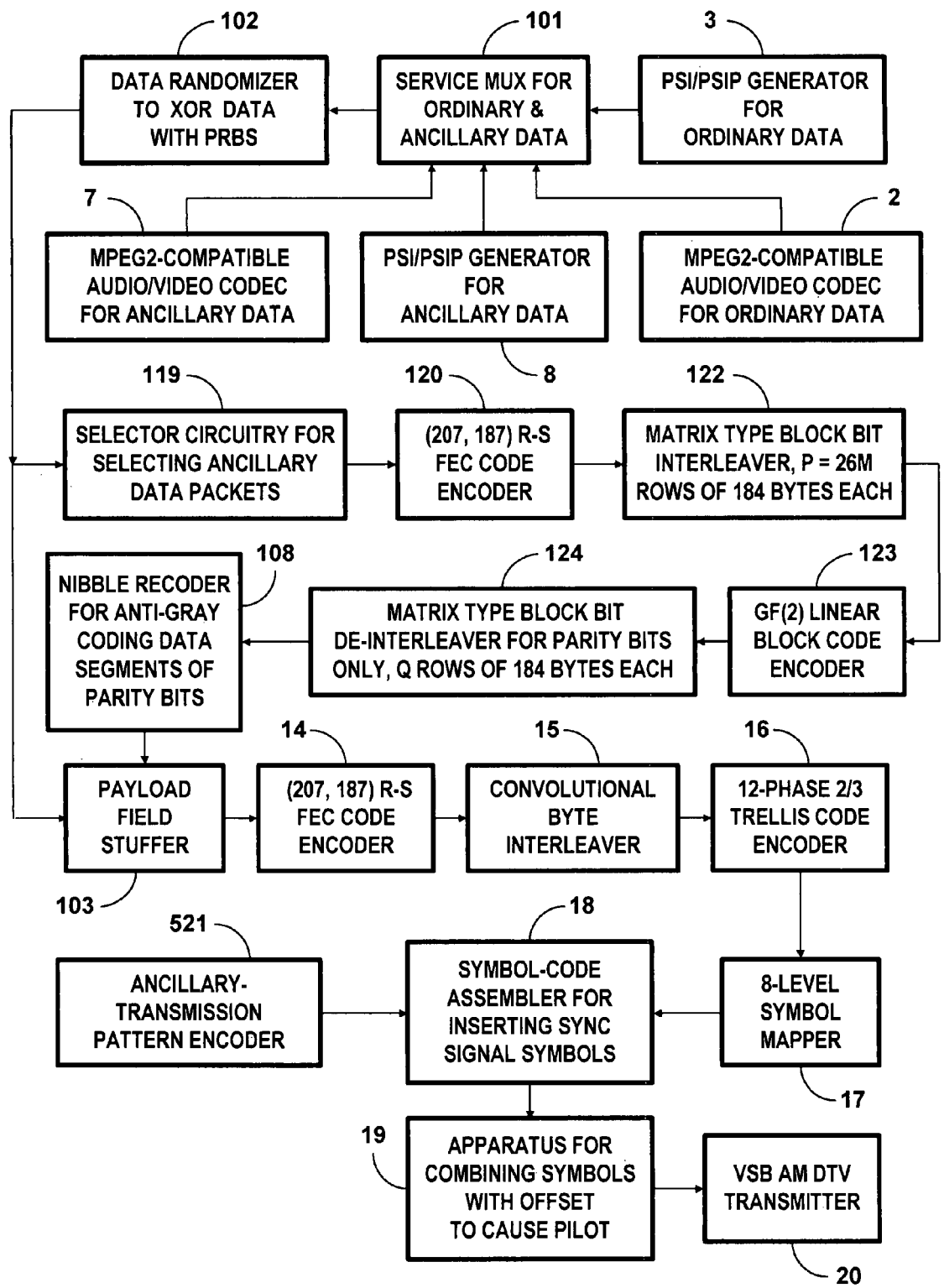
FIG. 33 is a general schematic diagram of transmitter apparatus for broadcast digital television signals using SCC in which LBC that is transversal to data segments is followed by convolutional ⅔ trellis coding, which transmitter apparatus is an alternative to the FIG. 31 transmitter apparatus and also embodies aspects of the invention.

FIG. 33 shows DTV transmitter apparatus which the parity bytes for LBC that is transversal to data segments are stuffed into the payload fields of MPEG-2-compatible packets that legacy DTV receivers will disregard. The FIG. 33 DTV transmitter apparatus is generally similar in structure and operation to the FIG. 31 DTV transmitter apparatus except for the payload field selector circuitry 104, the matrix type block bit interleaver 105, the encoder 106 for GF(2) linear block code, and the matrix type block bit de-interleaver 107 being replaced by other elements.

In the FIG. 33 DTV transmitter apparatus the data randomizer 102 is connected for also supplying the randomized 187-byte MPEG-2-compatible data packets to selector circuitry 119 that selects just the packets of ancillary data for application to the input port of an encoder 120 that generates a respective (207, 187) Reed-Solomon forward-error-correction codeword in response to each of these packets. The R-S FEC codewords that the encoder 120 supplies from its output port are preceded by a sync byte and are applied to the input port of a matrix type block bit interleaver 122. Each of two banks of memory within the interleaver 122 has a plurality P rows of byte storage locations with 184 byte storage locations per row. P is a multiple M times twenty-six. M times twenty-three successive 208-byte data segments can be temporarily stored within each bank of memory. Their successive bits are written into bit-storage locations of one bank of memory row by row while bits are read from bit-storage locations of the other bank of memory column by column. The successive 26M-bit slivers read from respective columns of a bank of memory in the interleaver are supplied to the input port of an encoder 123 for encoding into respective systematic GF(2) linear block codewords. The encoder 123 supplies these codewords from its output port to the input port of a matrix type block bit de-interleaver 124. Each of two banks of memory within the de-interleaver 124 has Q rows of byte storage locations with 184 byte storage locations per row. The parity bits from successive LBC words are written into bit-storage locations of one bank of memory column by column, while parity bits are read from bit-storage locations of the other bank of memory row by row to the output port of the block bit de-interleaver 124. The output port of the block bit de-interleaver 124 is connected for supplying the stream of interleaved parity bits of the nibble recoder 108.

In accordance with the invention, the nibble recoder 108 anti-Gray codes successive 2-bit nibbles of the received stream of interleaved parity bits to generate its response supplied to the payload field stuffer 103. The payload field stuffer 103 reproduces in its response the randomized 187-byte MPEG-2-compatible data packets from the data randomizer 102, except for replacing the placeholder bytes in the adaptation fields of selected ones of those data packets with anti-Gray coding from the nibble recoder 108.

Choosing M to be three and P to be 78 facilitates the LBC encoder 123 using (24, 12) extended binary Golay codes as the GF(2) LBC. The (24, 12) binary extended Golay coding will generate 78 packets of parity bits from the transversal linear block coding of 69 MPEG-2-compatible packets of ancillary data. Choosing M to be six and P to be 156 facilitates the LBC encoder 123 using (23, 12) binary Golay codes as the GF(2) LBC. The (23, 12) binary Golay coding will generate 143 packets of parity bits from the transversal linear block coding of 138 MPEG-2-compatible packets of ancillary data. Choosing M to be four and P to be 104 facilitates the LBC encoder 123 using (15, 8) Hamming codes as the GF(2) LBC. The (15, 8) Hamming coding will generate 91 packets of parity bits from the transversal linear block coding of 98 MPEG-2-compatible packets of ancillary data.

Figure 34:
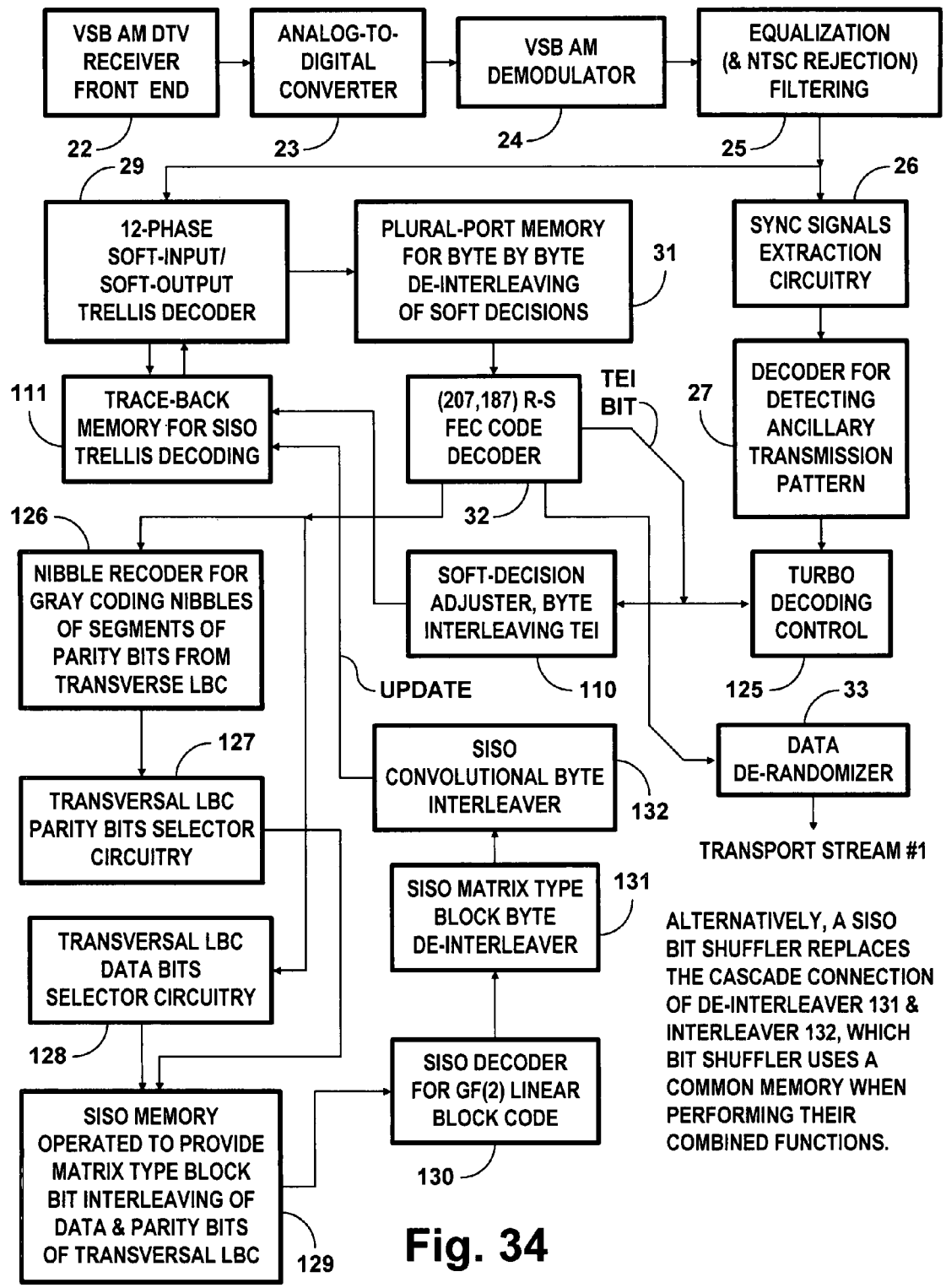
FIG. 34 is a general schematic diagram of receiver apparatus for broadcast digital television signals transmitted by transmitter apparatus of the sort shown in FIG. 33, which receiver apparatus embodies aspects of the invention.

FIG. 34 shows receiver apparatus for DTV signals transmitted by transmitter apparatus of the sort shown in FIG. 33, which receiver apparatus uses turbo decoding procedures. The FIG. 34 DTV receiver apparatus includes the elements 22, 23, 24, 25, 26, 27, 29, 31, 32 and 33, which are connected and operated the same way as in the DTV receiver apparatuses of FIGS. 14 and 32, except as particularly noted hereafter. The decoder 27 is connected for supplying ancillary transmission pattern information to turbo decoding control circuitry 125 that controls turbo decoding in the FIG. 34 DTV receiver apparatus. The R-S decoder 32 in the FIG. 34 DTV receiver apparatus is not connected for supplying soft decisions concerning 187-byte data packets that have been corrected insofar as possible to outer coding selector circuitry 112.

Instead, the R-S decoder 32 is connected for supplying soft decisions concerning 187-byte data packets that have been corrected insofar as possible to the input port of a nibble recoder 126 and to the input port of selector circuitry 127 for transversal LBC data bits. The data bits of the transversally linear block coded ancillary data are reproduced from a low source impedance at the output port of the selector circuitry 127, which output port otherwise exhibits a high source impedance.

In accordance with an aspect of the invention, the nibble recoder 126 re-codes the reproduced $X_2$ and $X_1$ bits in each nibble of the 187-byte data packets supplied thereto. The nibble recoder 126 uses the same one of the coding tables shown in FIGS. 6 through 13 for Gray coding nibbles as was used by the nibble recoder 124 for anti-Gray coding in the FIG. 33 DTV transmitter apparatus transmitting DTV signal to the FIG. 34 DTV receiver apparatus. The nibble recoder 126 also adjusts the respective soft-decision information in its response regarding each of the two bits in each successive nibble, to take into account the way in which the reproduced bit-interleaved outer coding maps against data slicing. The output signal from the nibble recoder 126 is supplied to the input port of selector circuitry 128 for transversal LBC parity bits. The selector circuitry 128 reproduces the soft decisions concerning parity bits of transversally linear block coded ancillary data from a low source impedance at its output port, which output port otherwise exhibits a high source impedance.

A soft-input/soft-output memory 129 is operated to provide matrix type block bit interleaving of both the data bits and the parity bits of the transversally linear block coded ancillary data preparatory to their being supplied to a soft-input/soft-output decoder 130 for GF(256) linear block coding. The data bits of the transversally linear block coded ancillary data reproduced from a low source impedance at the output port of the selector circuitry 127 are written to the appropriate bit-storage locations in the SISO memory 129 row by row. The parity bits of the transversally linear block coded ancillary data reproduced from a low source impedance at the output port of the selector circuitry 128 are written to the appropriate bit-storage locations in the SISO memory 129 row by row. The transversal LBC as thus temporarily stored is read to the SISO decoder 130, scanning the bit-storage locations column by column. The respective operations of the selector circuitry 127 for transversal LBC data bits, the selector circuitry 128 for transversal LBC parity bits, the SISO memory 129 and the SISO decoder 130 for transversal LBC are controlled by control signals supplied them from the turbo decoding control circuitry 125. These control signals are transmitted via connections not explicitly shown in FIG. 34.

FIG. 34 shows an output port of the SISO decoder 130 connected for supplying soft decisions to an input port of a soft-input/soft-output matrix type block bit de-interleaver 131 as input signal thereto. FIG. 34 further shows an output port of the block bit de-interleaver 131 connected for supplying soft decisions to an input port of a soft-input/soft-output convolutional byte interleaver 132 as input signal thereto. FIG. 34 further shows an output port of the convolutional byte interleaver 132 connected for supplying soft decisions to an input port of the trace-back memory 111 of the 12-phase SISO trellis decoder 29 for completing the turbo feedback connection to that decoder 29. The operations of the cascaded matrix type block bit de-interleaver 131 and the convolutional byte interleaver 132 are controlled by control signals supplied them from the turbo decoding control circuitry 125 via connections not explicitly shown in FIG. 34. In practice, the cascade connection of the de-interleaver 131 and the interleaver 132 shown in FIG. 34 is apt to be replaced by a soft-input/soft-output decoder bit shuffler that uses common memory for performing the combined functions of the replaced elements.

In the turbo decoding done in the FIG. 34 DTV receiver apparatus, the ultimate decoding of MPEG-2-compatible data packets having transversal linear block coding is performed by the 12-phase SISO trellis decoder 29. Turbo decoding of portions of data fields containing interleaved (207, 187) R-S FEC codewords, the payload portions of which are transversely linear block coded, is discontinued if the R-S decoder 32 finds all of those (207, 187) R-S FEC codewords to be correct or to have been corrected. The turbo decoding control circuitry 125 keeps track of the TEIs that are supplied to it by the R-S decoder 32 for this purpose. If the turbo decoding procedures tend to reiterate too many times, the turbo decoding control circuitry 125 will curtail them.

Turbo decoding procedures in the receiver apparatuses of FIGS. 14, 18, 22, 24, 28, 30, 32 and 34 involve the 12-phase SISO trellis decoder 29 repeating the soft-decision trellis decoding of the transversely linear block coded payload portions of certain ones of the (207, 187) R-S FEC codewords. These procedures provide a result that is apt to be overlooked and apt not to be foreseen. The repeated trellis decoding can also modify others of the (207, 187) R-S FEC codewords so that the R-S decoder 32 will finds them to be correct or to have been corrected.

One skilled in the art of digital communication will be enabled by acquaintance with this document to employ anti-Gray coding followed by trellis coding in a variety of transmitter apparatuses. One skilled in the art of digital communication will be enabled by acquaintance with this document to design receiver apparatuses for receiving signals which employ anti-Gray coding together with trellis coding, which receiver apparatuses follow the decoding of trellis coding with Gray coding. This should be borne in mind when construing the claims that follow.

What is claimed is:

1. A method for transmitting bits of an electric signal, said method comprising the steps of:
   (207, 187) Reed-Solomon forward-error-correction (R-S FEC) coding successive groups of bits;
   anti-Gray coding the R-S FEC coded successive groups of bits to generate a succession of anti-Gray code symbols;
   trellis coding the succession of anti-Gray symbols to generate a succession of trellis code symbols;
   modulating a radio-frequency carrier in accordance with said succession of trellis code symbols; and
   transmitting the resulting modulated radio-frequency carrier.

2. The claim 1 method wherein said step of modulating a radio-frequency carrier in accordance with said succession of trellis code symbols comprises substeps of:
   mapping said trellis code symbols into a multiple-level binary-coded modulation signal; and
   modulating said radio-frequency carrier in accordance with said multiple-level binary-coded modulation signal, thus to generate a vestigial-sideband amplitude-modulated radio-frequency carrier.

3. The claim 2 method wherein the trellis coding of the succession of anti-Gray symbols to generate a succession of trellis code symbols is performed intermittently with the trellis coding of other symbols to generate said succession of trellis code symbols.

4. The claim 3 method wherein said succession of anti-Gray symbols as supplied for trellis coding are arranged in different order in time than said groups of bits are.

5. The claim 4 method wherein said step of trellis coding employs ⅔ trellis coding performed on a twelve-phase basis.

6. A method for transmitting bits of coded ancillary data within a digital television signal, said method comprising the steps of:
   (207, 187) Reed-Solomon forward-error-correction (R-S FEC) coding said ancillary data;
   coding the R-S FEC coded ancillary data using an outer encoder to generate outer encoded ancillary data;
   anti-Gray coding successive pairs of bits of said outer encoded ancillary data to generate successive two-bit anti-Gray code symbols;
   interleaving said two-bit anti-Gray code symbols to generate interleaved two-bit anti-Gray code symbols;
   time-division multiplexing said interleaved two-bit anti-Gray code symbols with other two-bit symbols of said digital television signal to generate a multiplexed response;
   ⅔ trellis coding the two-bit symbols in said multiplexed response to generate a succession of three-bit trellis-code symbols, said ⅔ trellis coding being performed on a twelve-symbol-phase basis by an inner encoder;
   generating an eight-level modulating signal responsive in part to said succession of three-bit trellis code symbols;
   modulating the amplitude of a radio-frequency carrier in accordance with said eight-level modulating signal; and
   transmitting the resulting amplitude-modulated radio-frequency carrier.

7. The claim 6 method wherein said outer encoder used in said step of coding said ancillary data to generate outer encoded ancillary data performs convolutional coding to generate said outer encoded ancillary data, which said outer encoded ancillary data is convolutionally coded.

8. The claim 6 method wherein said outer encoder used in said step of coding said ancillary data to generate outer encoded ancillary data performs block coding to generate said outer encoded ancillary data, which said outer encoded ancillary data is block coded.

9. The claim 6 method wherein said outer encoder used in said step of coding said ancillary data to generate outer encoded ancillary data performs parallel concatenated convolutional coding to generate said outer encoded ancillary data, which said outer encoded ancillary data is parallel concatenated convolutional coded.

* * * * *